US012101938B2

(12) United States Patent
Lin et al.

(10) Patent No.: US 12,101,938 B2
(45) Date of Patent: Sep. 24, 2024

(54) SEMICONDUCTOR MEMORY DEVICES AND METHODS OF MANUFACTURING THEREOF

(71) Applicant: Taiwan Semiconductor Manufacturing Company, Ltd., Hsinchu (TW)

(72) Inventors: Meng-Han Lin, Hsinchu (TW); Chia-En Huang, Xinfeng Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 447 days.

(21) Appl. No.: 17/490,113

(22) Filed: Sep. 30, 2021

(65) Prior Publication Data

US 2022/0415922 A1 Dec. 29, 2022

Related U.S. Application Data

(60) Provisional application No. 63/214,472, filed on Jun. 24, 2021.

(51) Int. Cl.
*H10B 51/20* (2023.01)
(52) U.S. Cl.
CPC .................................. *H10B 51/20* (2023.02)

(58) Field of Classification Search
CPC ........ H10B 51/20; H10B 43/10; H10B 43/27; H10B 43/40; H10B 43/35; H10B 51/00; H10B 51/30; G11C 16/0483
See application file for complete search history.

(56) References Cited

U.S. PATENT DOCUMENTS

| | | | |
|---|---|---|---|
| 11,069,410 B1* | 7/2021 | Cui ....................... | G11C 11/005 |
| 11,158,604 B2* | 10/2021 | Cheng ................. | H01L 25/0652 |
| 2023/0232625 A1* | 7/2023 | Lin ........................ | H10B 43/27 |
| | | | 257/314 |

* cited by examiner

*Primary Examiner* — Allison Bernstein
(74) *Attorney, Agent, or Firm* — FOLEY & LARDNER LLP

(57) ABSTRACT

A semiconductor device includes a substrate having a first area and a second area. The semiconductor device in the first area includes a first memory layer and a first semiconductor channel coupled to a portion of the first memory layer. The semiconductor device in the first area further includes a first conductive structure and a second conductive structure coupled to end portions of the first semiconductor channel. The semiconductor device in the second area includes a third conductive structure and a second memory layer. The semiconductor device in the second area includes a second semiconductor channel that comprises: (i) a first vertical portion coupled to a portion of the second memory layer; and (ii) a lateral portion coupled to a top surface of the third conductive structure. The semiconductor device in the second area includes a fourth conductive structure coupled to an end portion of the second semiconductor channel.

20 Claims, 27 Drawing Sheets

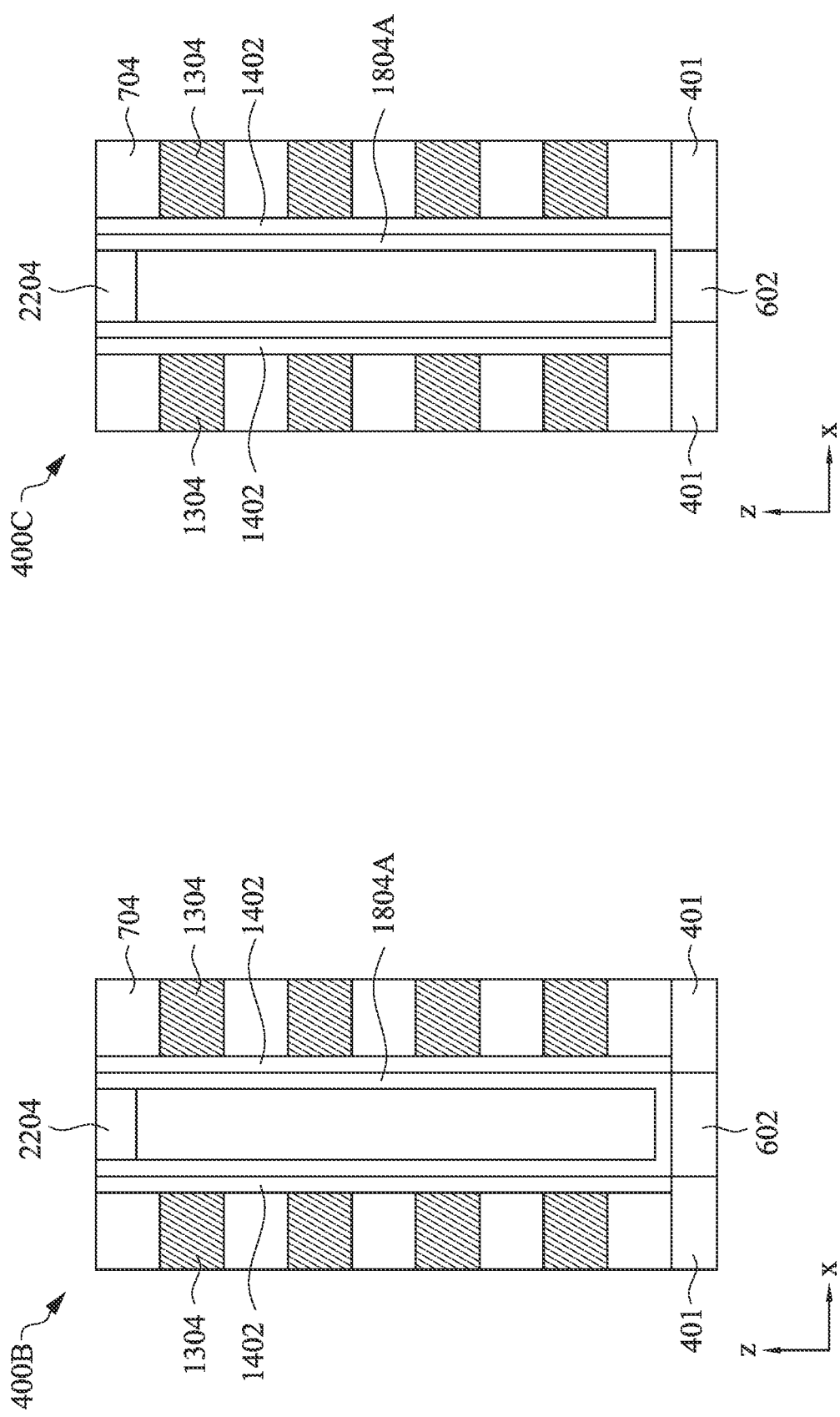

SEMICONDUCTOR MEMORY DEVICES AND METHODS OF MANUFACTURING THEREOF

CROSS-REFERENCE TO RELATED APPLICATION

This application claims priority to and the benefit of U.S. Provisional Application No. 63/214,472, filed Jun. 24, 2021, entitled "WITHIN-WAFER MEMORY INTEGRATION," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. Recently, three dimensional (3D) memory devices have been introduced as the next generation memory device of choice for computing-in-memory (CIM) applications because the memory devices provide lower area and high performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 25 illustrates a cross-sectional view of a second area of a 3D memory device during a stage of fabrication, in accordance with some embodiments.

FIG. 26 illustrates a cross-sectional view of a second area of a 3D memory device during a stage of fabrication, in accordance with some embodiments.

DETAILED DESCRIPTION

Figure 1:
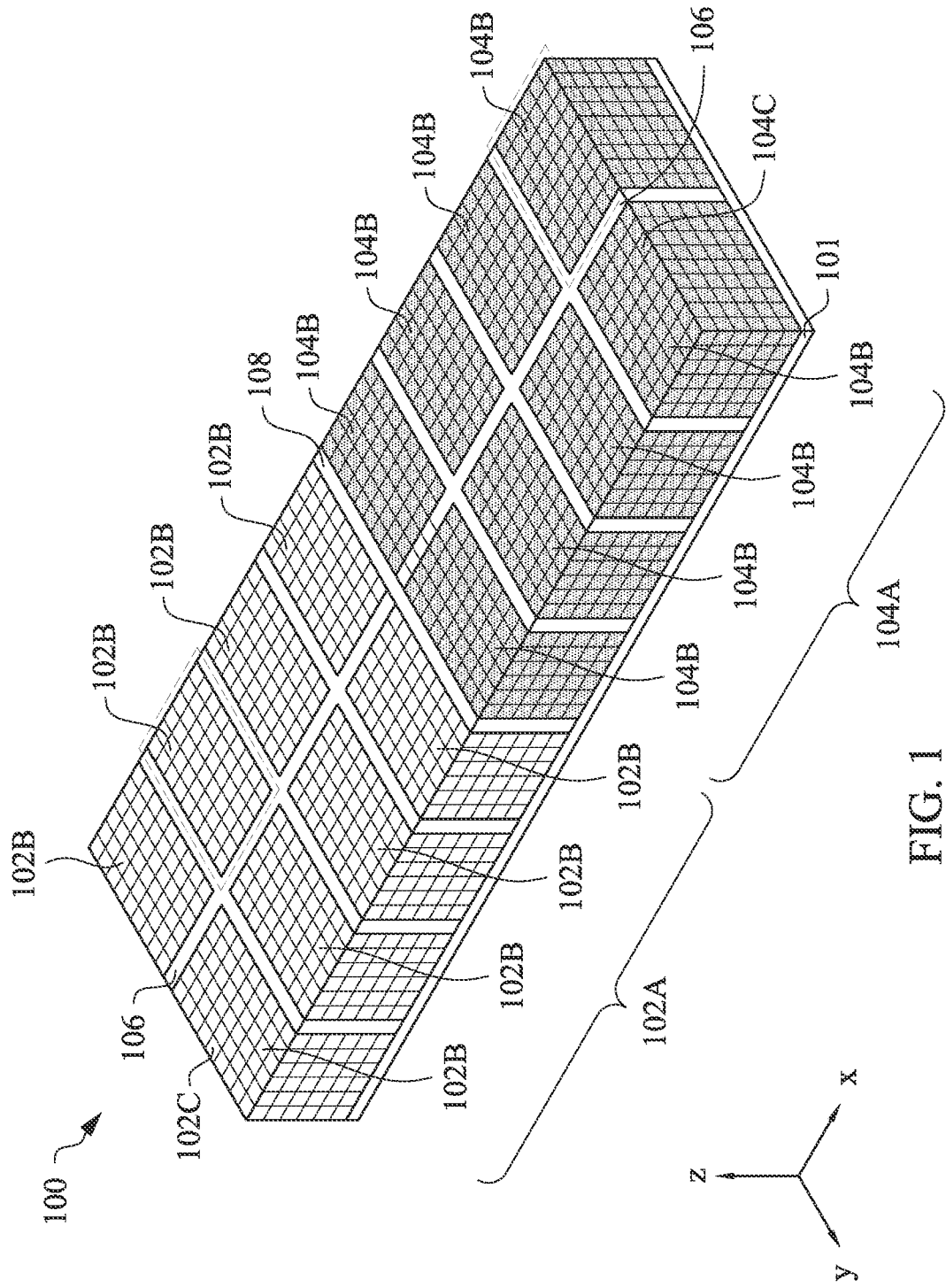
FIG. 1 illustrates a perspective view of a 3D memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, 3D memory devices (or systems) have been growing in popularity for their ability to have high performance, low power, and area reduction. Further, there is a growing need for memory devices that are both fast and able to store a dense amount memory in various applications such as CIM applications. For CIM applications, memory devices are desired to have multiple functions such as storing a relatively large amount of data while computing in a relatively high speed. In this regard, a memory device may include multiple types of memory configurations (e.g., memory structures). In the existing technologies that do not use the disclosed devices and methods, different types of memory structures may be formed on respective different chips and then operatively coupled to each other through an integration process (e.g., wafer bonding, bump integration, etc.), which may incur additional propagation delay and/or signal drop while transferring data through those integration structures. Thus, the existing 3D memory devices have not been entirely satisfactory in every aspect.

The present disclosure provides various embodiments of a 3D memory device having multiple different memory structures formed on a single chip, and the methods of forming the same. In one embodiment, a first one of the memory structures may be configured to be storage-orientated, and a second one of the memory structures may be configured to be speed-orientated. By integrating these two memory structures on a single chip, multiple functions can be integrated on a single chip. Further, instead of respectively fabricating them on different chips and then attaching one to the other, various issues specified above can be avoided. For example, the first memory structure may be implemented as an AND memory which can have the advantages of computing data in a relatively high speed, and the second memory structure may be implemented as a NAND memory which can have the advantages of having more cells formed in a compact area (thereby storing relatively more data).

Figure 2:
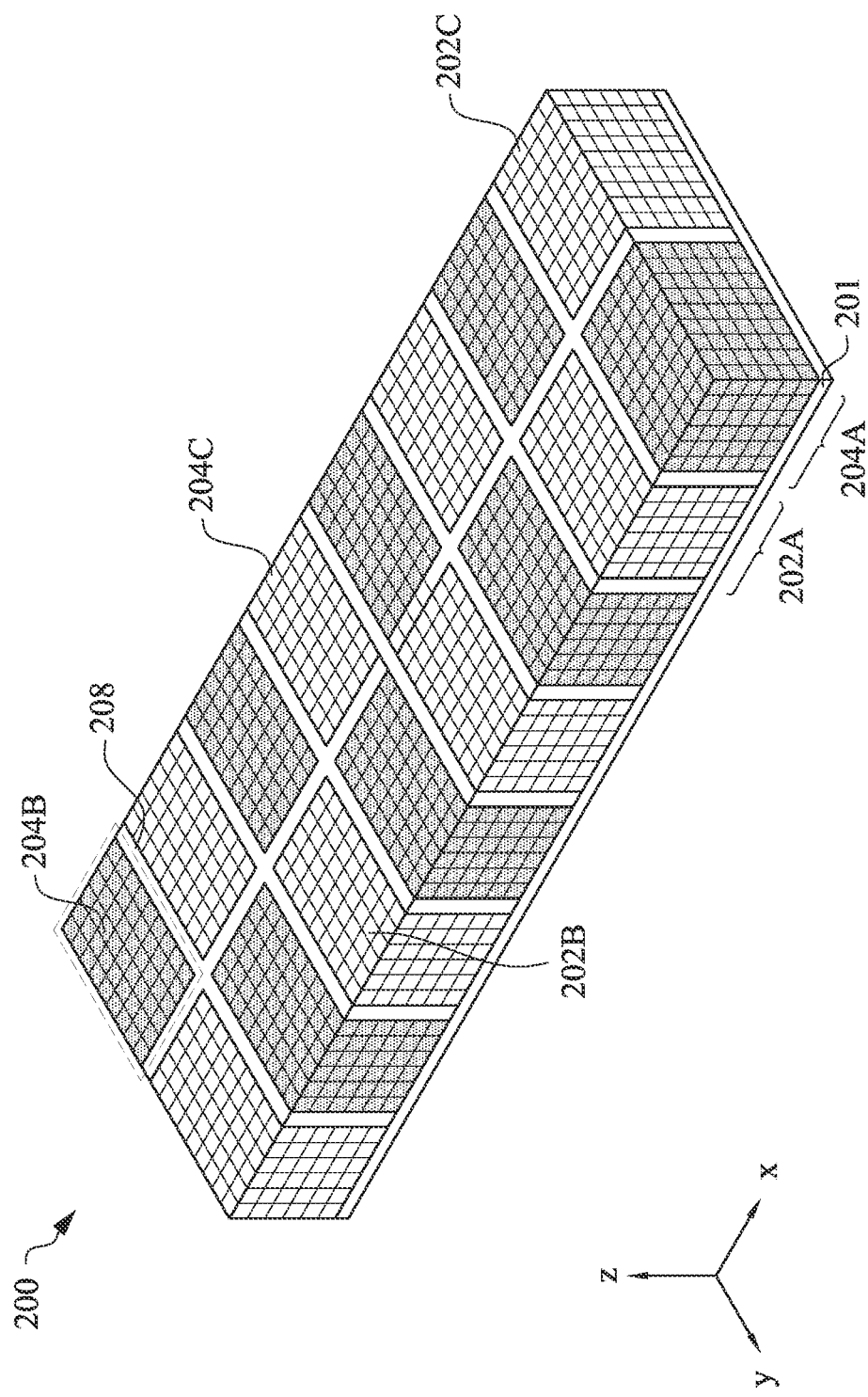
FIG. 2 illustrates a perspective view of a 3D memory device, in accordance with some embodiments.

FIGS. 1 and 2 respectively illustrate two example schematic diagrams of a 3D memory device that includes two or more different types of memory structures integrated or otherwise formed on a single chip, in accordance with some embodiments. It should be appreciated that the 3D memory device of FIGS. 1 and 2 are merely illustrative examples, and thus, the 3D memory device can include any of various other components, while remaining within the scope of the present disclosure.

Referring first to FIG. 1, 3D memory device 100 includes a memory bank 102A, a memory bank 104A, and a bank isolation region 108. The memory bank 102A and the memory bank 104A may be integrated or formed on a single chip 101 (e.g., wafer), in accordance with various embodiments. The memory bank 102A includes a plurality of memory arrays (or sub-arrays) 102B, which includes a plurality of memory cells 102C. The memory bank 104A includes a plurality of memory arrays (or sub-arrays) 104B, which includes a plurality of memory cells 104C. Memory arrays 102B are separated from each other within the memory bank 102A by sub-array isolation layers 106, and the memory arrays 104B are separated from each other within the memory bank 104A by the sub-array isolation layers 106. The bank isolation region 108 includes an insulation layer that separates the memory bank 102A and memory bank 104A from each other. Although the memory device 100 is shown to have a certain number of cells, embodiments are not limited thereto, and there can be more or fewer memory cells and still be within the scope of the present disclosure. Furthermore, the memory cells 102 and 104 are shown to have a cubic shape for simplicity purposes only and embodiments are not limited thereto.

The memory device 100 includes a 2×4 structure on both of the memory banks 102A and 104A. Alternatively stated, there are 2 rows and 4 columns of memory arrays 102B in the memory bank 102A, and 2 rows and 4 columns of memory arrays 104B in memory bank 104A. However, embodiments are not limited thereto, and the memory device 100A can include any combination of memory arrays 102B and 104B.

In some embodiments, the memory cells 102C may be implemented as a first type of memory structure that is suitable for computing at a high speed, and the memory cells 104C may be implemented as a second type of memory structure that is suitable for storing a large amount of data in a compact area. For example a number of memory cells 102C can be vertically disposed with respect to one another to form an AND memory string, and a number of memory cells 104C can be vertically disposed with respect to one another to form a NAND memory string. A number of such AND memory strings can be laterally disposed with respect to one another to form an AND memory array, and a number of such NAND memory strings can be laterally disposed with respect to one another to form an NAND memory array.

Details of the AND memory strings/array and NAND memory strings/array will be discussed below.

Referring next to FIG. 2, 3D memory device 200 includes a plurality of memory banks 202A, a plurality of memory banks 204A, and a bank isolation region 108. The memory banks 202A and the memory banks 204A may be integrated or formed on a single chip 201 (e.g., wafer), in accordance with various embodiments. Each memory bank 202A includes a memory array 202B which includes a plurality of memory cells 202C. Each memory bank 204A includes a memory array 204B which includes a plurality memory cells 204C. The bank isolation region 108 includes an insulation layer that separates the memory banks 202A and 204B from each other. Although, the memory device 200 is shown to have a certain number of cells, embodiments are not limited thereto, and there can be more or fewer memory cells and still be within the scope of the present disclosure. Furthermore, the memory cells 202C and 204C are shown to have a cubic shape for simplicity purposes only and embodiments are not limited thereto.

In some embodiments, the memory cells 202C may be implemented as a first type of memory structure that is suitable for computing at a high speed, and the memory cells 204C may be implemented a second type of memory structure that is suitable for storing a large amount of data in a compact area. For example a number of memory cells 202C can be vertically disposed with respect to one another to form an AND memory string, and a number of memory cells 204C can be vertically disposed with respect to one another to form a NAND memory string. A number of such AND memory strings can be laterally disposed with respect to one another to form an AND memory array, and a number of such NAND memory strings can be laterally disposed with respect to one another to form an NAND memory array. Details of the AND memory strings/array and NAND memory strings/array will be discussed below.

Figure 3:
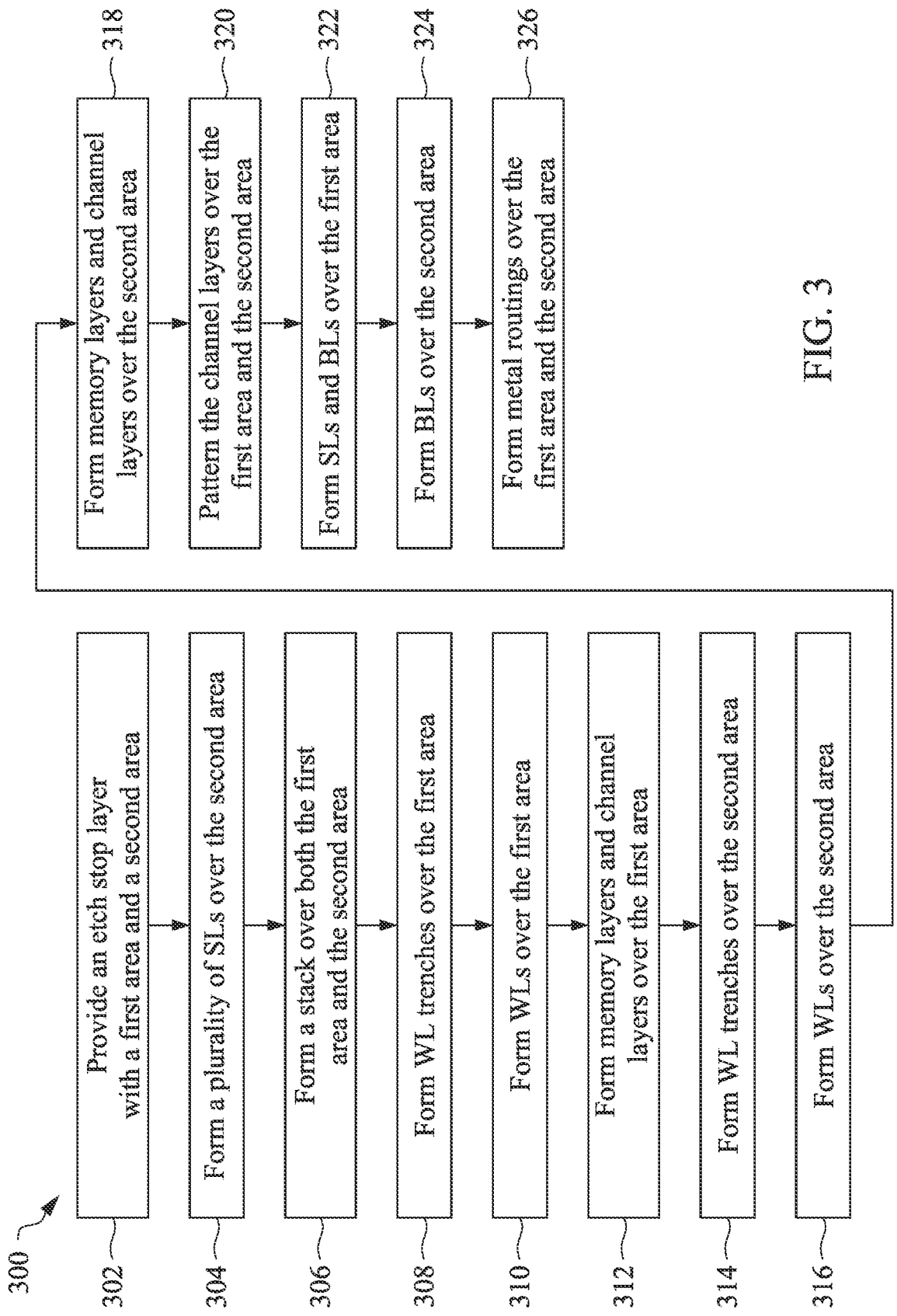
FIG. 3 is an example flow chart of a method for forming a 3D memory device, in accordance with some embodiments.

FIG. 3 illustrates a flowchart of an example method 300 for forming at least a portion of a 3D memory device 400 (e.g., the memory devices 100 and 200 described with respect to FIGS. 1 and 2), in accordance with some embodiments. It should be noted that the method 300 is merely an example, and is not intended to limit the present disclosure. Accordingly, it is understood that the order of operation of the method 300 of FIG. 3 can change, that additional operations may be provided before, during, and after the method 300 of FIG. 3, and that some other operations may only be described briefly described herein.

In some embodiments, operations of the method 300 may be associated with perspective views of the example memory device 400 at various fabrication stages as shown in FIGS. 4, 5, 6, 7, 8, 9, 10, 11, 13, 14, 16, 18, 20, 22, 29, and 30. In addition, the operations of the method 300 are equally applicable to any other memory device. Although FIGS. 3-30 illustrate the memory device 400 including a plurality of memory cells, it should be understood the memory device 400 may include a number of other devices such as inductors, fuses, capacitors, coils, etc., which are not shown in FIGS. 3-30, for purposes of clarity of illustration.

In a brief overview, the method 300 may start with the operation 302 in which a semiconductor substrate with a first area and a second area is provided. The method 300 continues to operation 304 in which a plurality of SLs are formed over the second area. The method 300 continues to operation 306 in which a stack is formed over both the first area and the second area. The method 300 continues to operation 308 in which WL trenches are formed over the first area. The method 300 continues to operation 310 in which WLs are formed over the first area. The method 300 continues to operation 312 in which memory layers and channel layers are formed over the first area. The method 300 continues to operation 314 in which WL trenches are formed over the second area. The method 300 continues to operation 316 in which WLs are formed over the second area. The method 300 continues to operation 318 in which memory layers and channel layers are formed over the second area. The method 300 continues to operation 320 in which the channel layers are patterned over the first area and the second area. The method 300 continues to operation 322 in which SLs and BLs are formed over the first area. The method 300 continues to operation 324 in which BLs are formed over the second area. The method 300 continues to operation 326 in which metal routings are formed over the first area and the second area.

Figure 4:
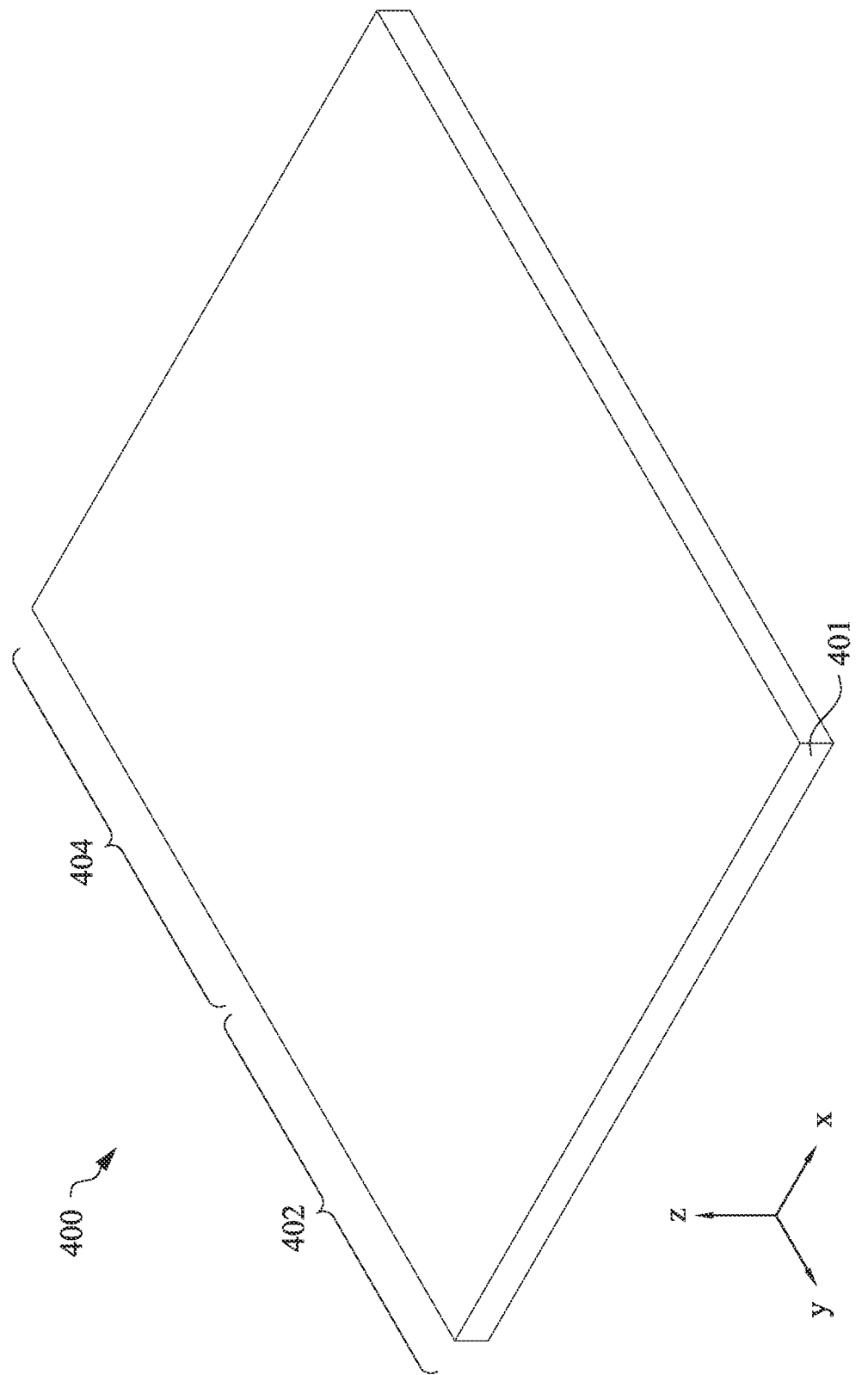
FIGS. 4, 5, 6, 7, 8, 9, 10, 11, 13, 14, 16, 18, 20, 22, 29, and 30 illustrate perspective views of an example 3D memory device (or a portion of the example 3D memory device) during various fabrication stages, made by the method of FIG. 3, in accordance with some embodiments.

Corresponding to operation 302 of FIG. 3, FIG. 4 is a perspective view of the memory device 400 including an etch stop layer 401 with a first area 402 and a second area 404, in accordance with some embodiments.

An etch stop layer 401 is provided. The etch stop layer 401 may comprise a suitable material such as silicon oxide, silicon nitride, silicon oxynitride, titanium, titanium nitride, combinations thereof, or the like, and may be formed by a suitable formation method such as CVD, PVD, any other suitable method, or combinations thereof. The etch stop layer 401 extends in and is substantially planar in both the X-direction and the Y-direction. The etch stop layer 401 may have a thickness in the Z-direction in a range in between about 5 Angstroms and about 50 Angstroms, inclusive (e.g., 5, 15, 25, 35, 45, and 50 Angstroms) or any other suitable thickness.

As shown in FIG. 4, the etch stop layer 401 has a first area 402 and a second area 404, each of which extends over a respective area and is disposed next to the other. The first area 402 and second area 404 can define real state for two types of memory structures, respectively (e.g., similar to the configuration of the memory bank 102A and the memory bank 104A of FIG. 1). The first area 402 and the second area 404 may also be applied to other configurations (e.g., the memory banks 202A and the memory banks 204A of FIG. 2). The first area 402 and the second area 404 are shown as rectangular regions in the memory device 400, but it is understood that the can be any suitable shape such as, but not limited to, circular, oval, triangular, trapezoidal, or any combination thereof. The memory device 400 shows one first area 402 and one second area 404, but it is understood that any number of first areas 402 and second areas 404 may be formed on a memory device and in any configuration. The first area 402 and the second area 404 are substantially the same size, but it is understood that the either the first area 402 or the second area 404 may comprise a greater area of the etch stop layer 401 than the other.

Figure 5:
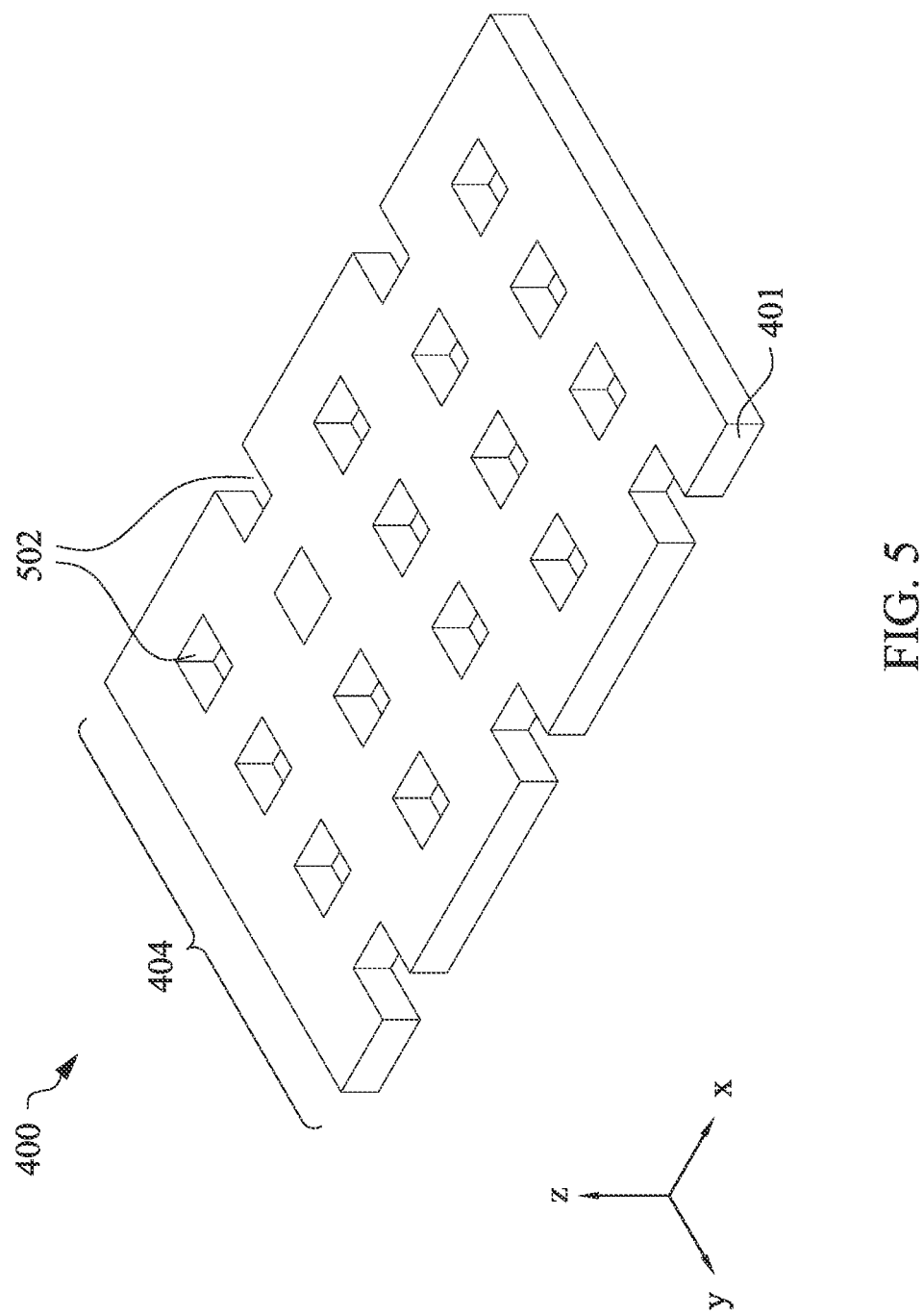

Corresponding to operation 304 of FIG. 3, FIG. 5 is a perspective view of the memory device 400 including a plurality of cavities 502 formed in the second area 404 of the etch stop layer 401 in order to form a plurality of second area SLs, in accordance with various embodiments. In some embodiments, a masking layer may be deposited over the first area 402 to prevent the formation of cavities in the first area 402.

The etch stop layer 401 is patterned to define initial footprints of the plurality of second area SLs 602. The patterning generates cavities 502 by first etching through the etch stop layer 401 in the Z-direction. The etch stop layer 401 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

The cavities 502 may extend completely through the etch stop layer 401. Any suitable number of cavities 502 may be formed. In some embodiments, the cavities 502 may be formed in columns along the Y-direction. Every other column may include cavities 502 slightly offset in the X-direction from the cavities 502 in the adjacent column.

Figure 6:
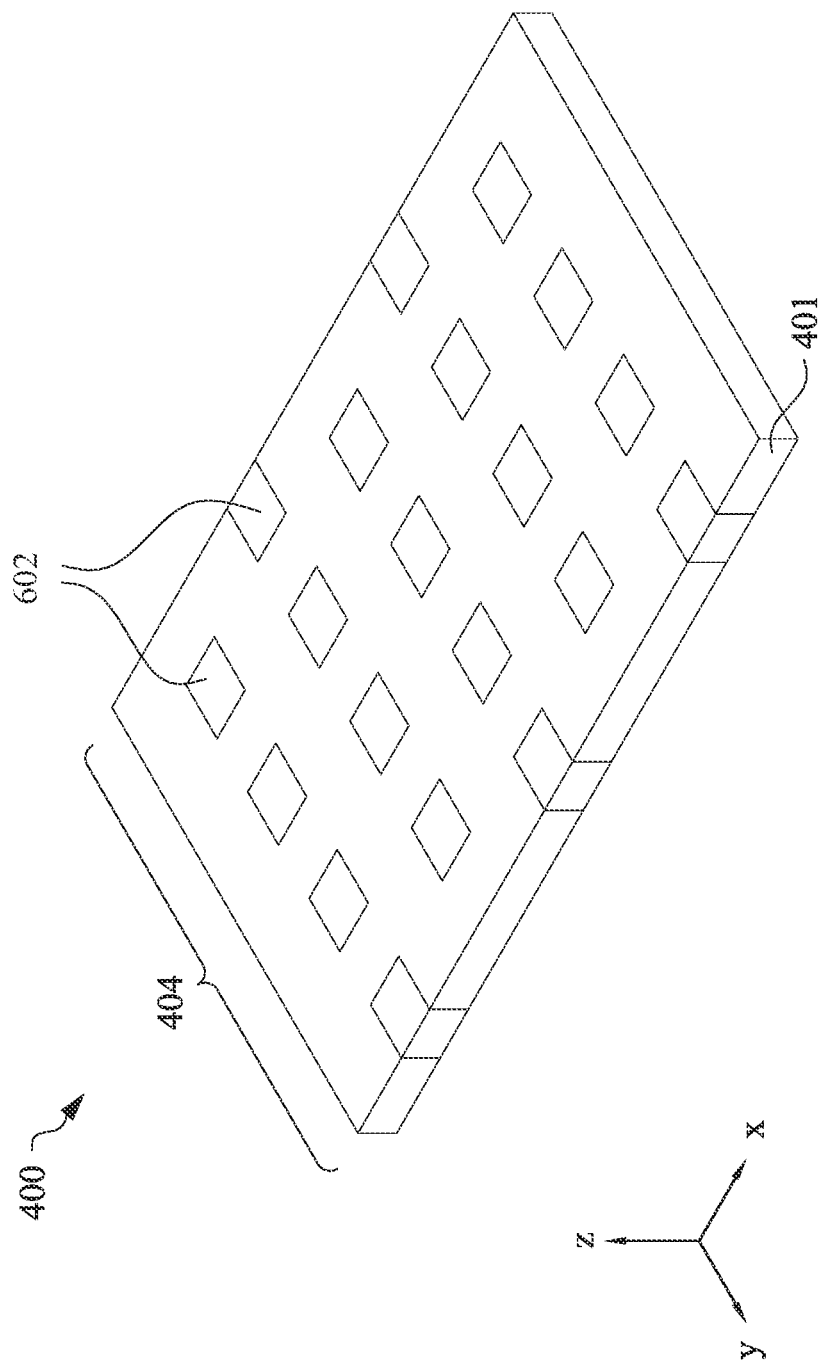

Also corresponding to operation 304 of FIG. 3, FIG. 6 is a perspective view of the memory device 400 including a plurality of second area SLs 602 formed in the second area 404 of the etch stop layer 401, in accordance with various embodiments. In some embodiments, the same (or another) masking layer may be deposited over the first area 402 to prevent the formation of SLs in the first area 402.

The second area SLs 602 (sometimes referred to as conductor structures or conductive structures) may be formed by, for example, a deposition process to fill the cavities 502 (FIG. 5) with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. In some other embodiments, the second area SLs 602 may be formed with a semiconductor material such as silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof.

The second area SLs 602 can be formed by overlaying the workpiece (e.g., to fill the recesses) with the above-listed material by, for example, chemical vapor deposition (CVD), physical vapor deposition (PVD), electroless plating, electroplating, or combinations thereof. In some embodiments, a control deposition step may be performed for forming the second area SLs 602 such that the deposition step is stopped when a height of the second area SLs 602 in the Z-direction are equal to a height of the etch stop layer 401. In other embodiments, a CMP operation may be performed after formation of the second area SLs 602 so as to ensure a top surface of each of the second area SLs 602 are level in the X-Y plane with the top of the etch stop layer 401. In other embodiments, a top surface of the second area SLs 602 may be higher than a top surface of the etch stop layer 401. In some other embodiments, the top surface of the second area SLs 602 may be lower than the top surface of the etch stop layer 401.

Figure 7:
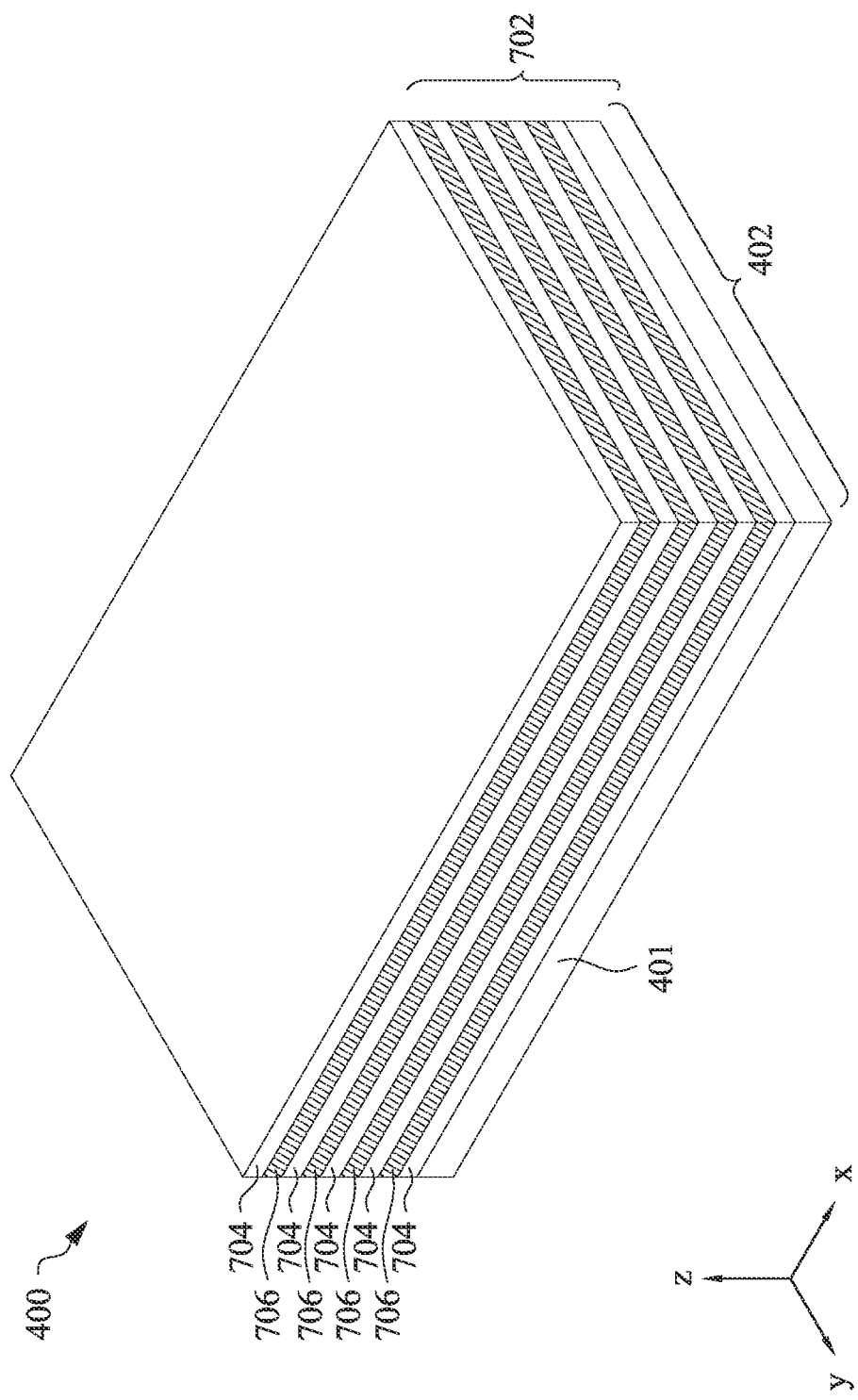
Figure 8:
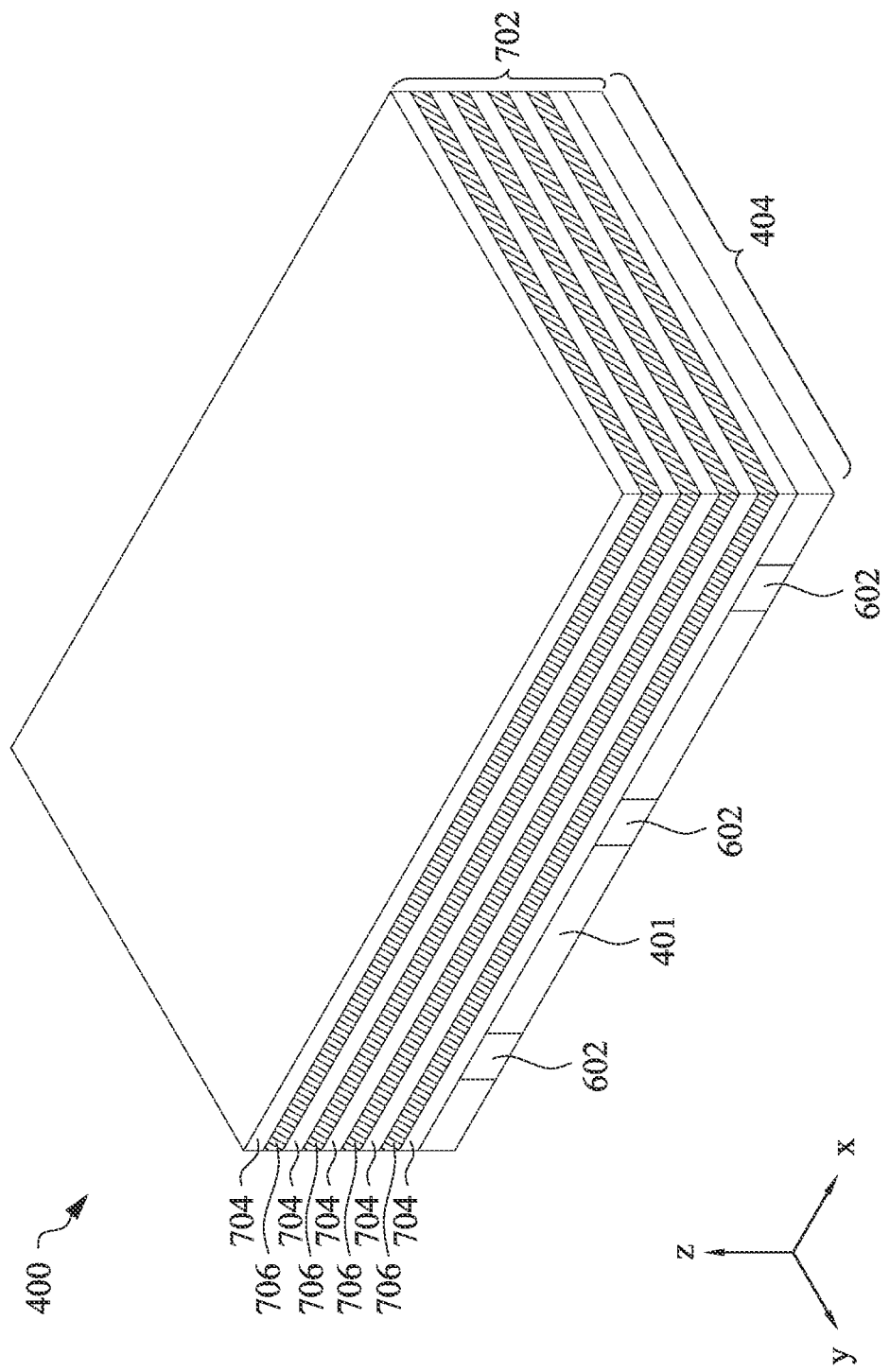

Corresponding to operation 306 of FIG. 3, FIGS. 7 and 8 illustrate perspective views of the memory device 400 in which a stack 702 is formed over the first area 402 and the second area 404, respectively, in accordance with some embodiments.

As shown in FIG. 7, the stack 702 is formed over the first area 402 of the etch stop layer 401. The stack 702 includes a plurality of insulating layers 704 and a plurality of sacrificial layers 706 alternately stacked on top of each other in the vertical direction (e.g., the Z-direction). For example, one of the sacrificial layers 706 is disposed over one of the insulating layers 704, then another one of the insulating layers 704 is disposed on the sacrificial layer 706, so on and so forth. As shown in FIG. 7, a topmost layer (e.g., a layer distanced most from the etch stop layer 401) and a bottommost layer (e.g., a layer most proximate to the etch stop layer 401) of the stack 702 may include an insulating layer 704. While FIG. 7 shows the stack 702 as including five insulating layers 704 and four sacrificial layers 706, the stack 702 may include any number of insulating layers 704 and sacrificial layers 706 (e.g., 5, 6, 7, 8, or even more). In various embodiments, if the number of sacrificial layers 706 in the stack 702 is n, a number of insulating layers 704 in the stack 702 may be n+1.

Each of the plurality of insulating layers 704 may have about the same thickness, for example, in a range of about 5 nm to about 100 nm, inclusive. Moreover, the sacrificial layers 706 may have the same thickness or different thickness from the insulating layers 704. The thickness of the sacrificial layers 706 may range from a few nanometers to few tens of nanometers (e.g., in a range of 5 nm to 100 nm, inclusive). In some embodiments, the thickness of the insulating layers 704 and the sacrificial layers 706 may be any other suitable thickness.

The insulating layers 704 and the sacrificial layers 706 have different compositions. In various embodiments, the insulating layers 704 and the sacrificial layers 706 have compositions that provide for different oxidation rates and/or different etch selectivity between the respective layers. The insulating materials that can be employed for the insulating layer 704 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. Other insulating materials are within the scope of the present disclosure. The sacrificial layers 706 may include an insulating material, a semiconductor material, or a conductive material. Non-limiting examples of the sacrificial layers 706 include silicon nitride, an amorphous semiconductor material (such as amorphous silicon), and a polycrystalline semiconductor material (such as polysilicon). In some embodiments, the insulating layers 704 may be formed from SiO, and the sacrificial layers 706 may be formed from SiN. The sacrificial layers 706 are merely spacer layers that are eventually removed and do not form an active component of the memory device 400.

In various embodiments, the insulating layers 704 and/or the sacrificial layers 706 may be grown over the etch stop layer 401. For example, each of the insulating layers 704 and the sacrificial layers 706 may be grown by a molecular beam epitaxy (MBE) process, a chemical vapor deposition (CVD) process such as a metal organic CVD (MOCVD) process, a furnace CVD process, an atomic layer deposition (ALD) process, and/or other suitable growth processes.

As shown in FIG. 8, the stack 702 is also formed over second area 404 of the etch stop layer 401 and is disposed above the second area SLs 602. The stack 702 may be formed concurrently over the first area 402 and the second area 404. Similar to the stack 702 in FIG. 7, the stack 702 over the second area 404 may include alternating insulating layers 704 and sacrificial layers 706 over the etch stop layer 401 and the second area SLs. The insulating layers 704 and the sacrificial layers 706 may be substantially planar along the X-Y plane.

Figure 9:
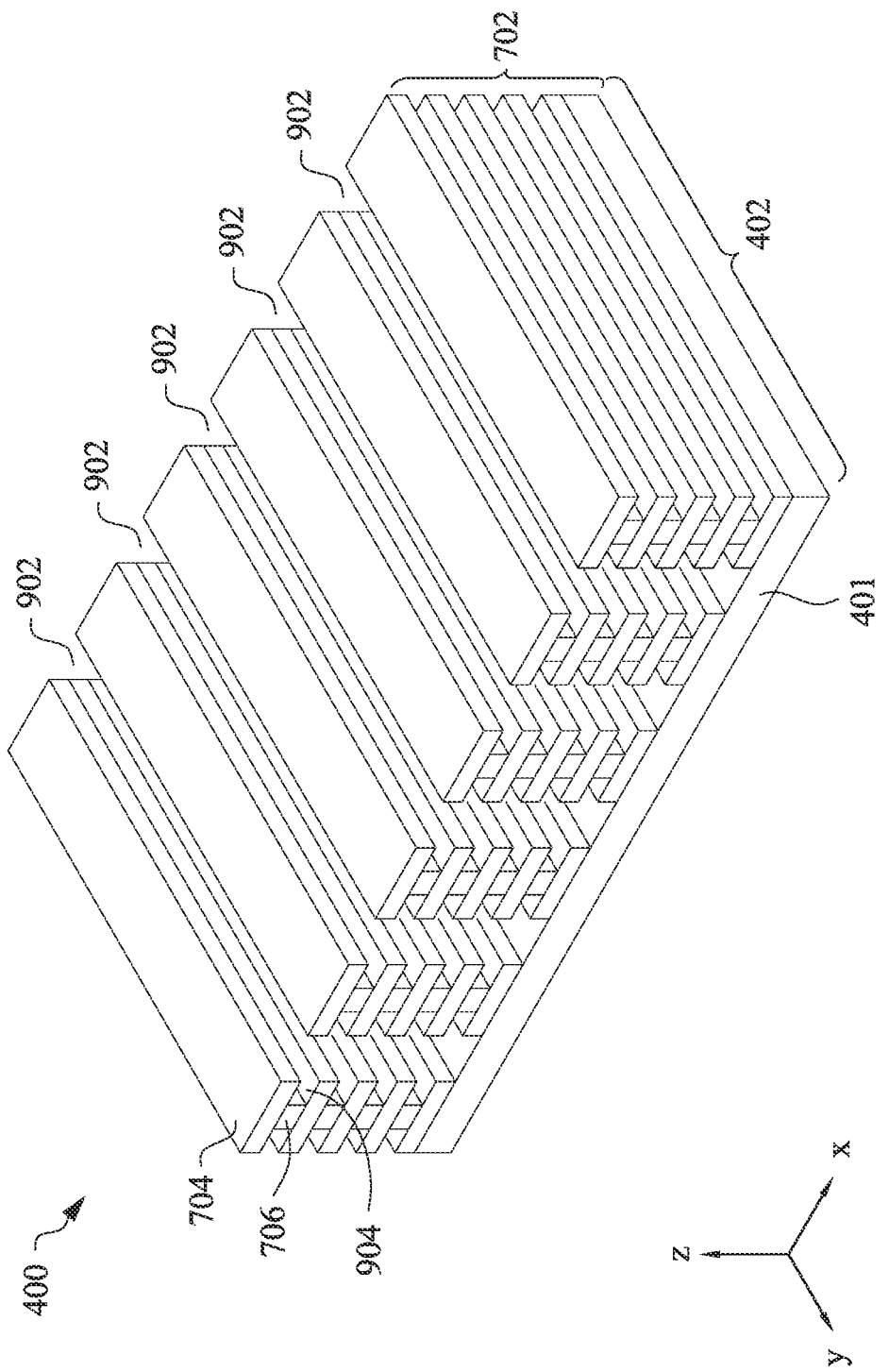

Corresponding to operation 308 of FIG. 3, FIG. 9 is a perspective view of the first area 402 of the memory device 400 with a plurality of first area trenches 902 formed and extending in the Y-direction and exposed surfaces of the sacrificial layers 706 are etched, in accordance with some embodiments. Although five first area trenches 902 are shown in the embodiment of FIG. 9, it should be understood that the memory device 400 can include any number of first area trenches while remaining within the scope of the present disclosure. In some embodiments, a masking layer may be formed over the second area 404 to prevent the formation of trenches in the second area 404.

The plurality of first area trenches 902 extending in the Y-direction, have been formed through the stack 702 up to the etch stop layer 401 by etching the stack 702 in the Z-direction. The etching process for forming the plurality of first area trenches 902 may include a plasma etching process, which can have a certain amount of anisotropic characteristic. For example, the first area trenches 902 may be formed, for example, by depositing a photoresist or other masking layer on a top surface of the memory device 400, i.e., the top surface of the topmost insulating layer 704 of the stack 702, and a pattern corresponding to the first area trenches 902 defined in the masking layer (e.g., via photolithography, e-beam lithography, or any other suitable lithographic process).

The first area trenches 902 may be formed using a plasma etching process (including radical plasma etching, remote plasma etching, and other suitable plasma etching processes, ME, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first area trenches 902.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 9, the etch used to form the plurality of first area trenches 902 etches through each of the sacrificial layers 706 and insulating layers 704 of the stack 702 such that each of the plurality of first area trenches 902 extend from the topmost insulating layer 704 through the bottommost insulating layer 704 to the etch stop layer 401. In other embodiments, a hard mask may be used. In some embodiments, the first area trenches 902 may be formed with a varying width along, the Y-direction. In some embodiments, the first area trenches 902 may be etched with an increasing width as the height of first area trench 902 increases in the Z-direction.

Then, the exposed surfaces of the sacrificial layers 706 within the first area trenches 902 are partially etched so as to reduce a width of the sacrificial layers 706 relative to the insulating layers 704 in the stack 702. The exposed surfaces extend in the Y-direction. In some embodiments, the sacrificial layers 706 may be etched using a wet etch process (e.g., hydrofluoric etch, buffered hydrofluoric acid). In other embodiments, the exposed surfaces of the sacrificial layers 706 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the sacrificial layers 706 in the X-direction reduces a width of the sacrificial layers 706 relative to the insulating layers 704 disposed in the stack 702 such that first cavities 904 are formed whose boundaries are formed by top and bottom surfaces of adjacent insulating layers 704 and a surface of the partially etched sacrificial layers 706 that face the first area trenches 902 and extend in the Y-direction.

In some embodiments, an adhesive layer is then formed on sidewalls of the first cavities 904. In some embodiments, the adhesive layer is optional. In various embodiments, the adhesive layers may include a material that has good adhesion with each of the insulating layers 704, the sacrificial layers 706, and the soon-to-be formed first area WLs, for example, Ti, Cr, etc. In some embodiments, the adhesive layer may include e.g., titanium (Ti), chromium (Cr), or any other suitable adhesive material. The adhesive layers may be deposited using any suitable method including, for example, molecular beam deposition (MBD), atomic layer deposition (ALD), PECVD, and the like. In some embodiments, the adhesive layer may have a thickness in a range of 0.1 nm to 5 nm, inclusive or any other suitable thickness.

Figure 10:
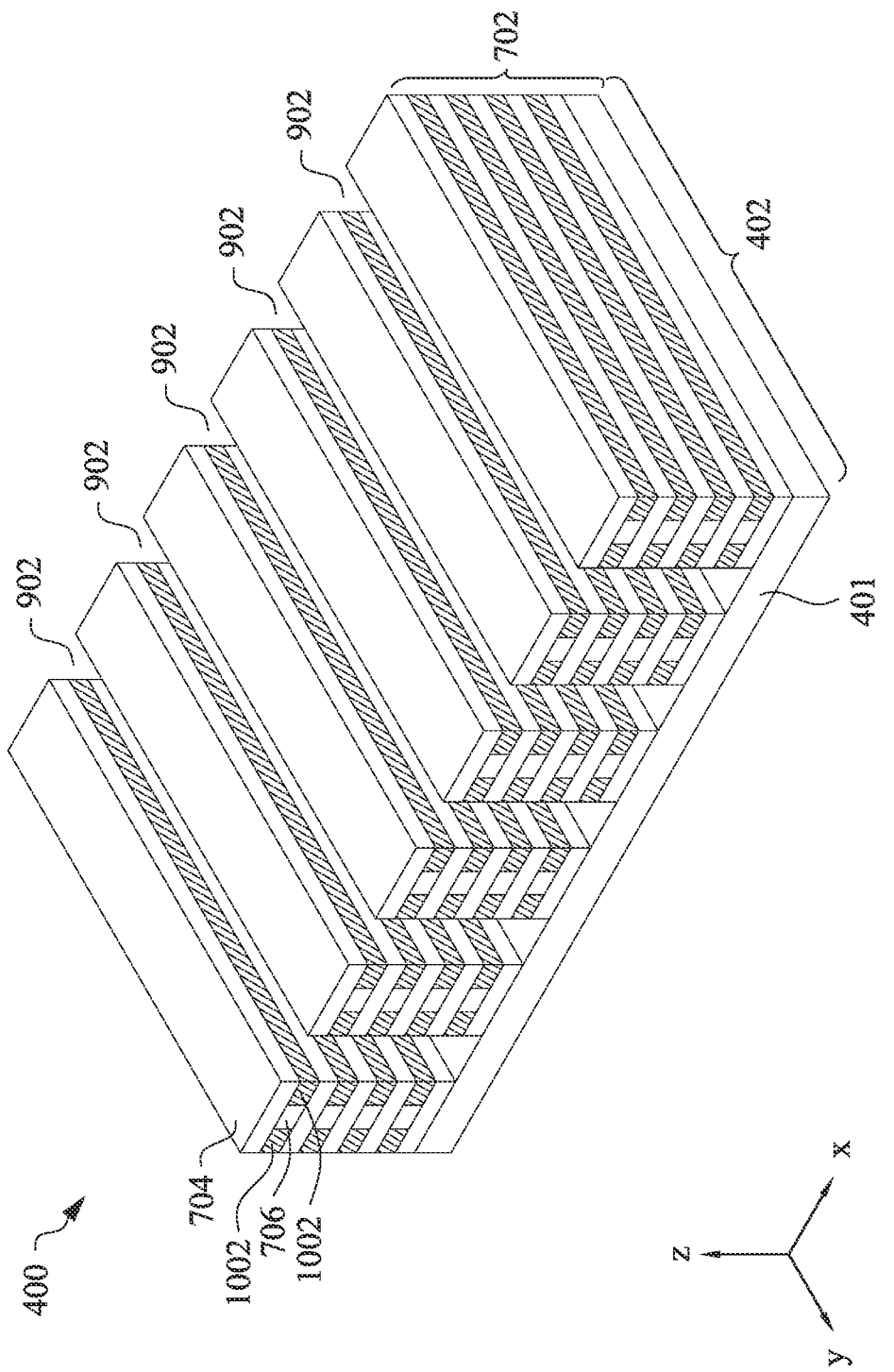

Corresponding to operation 310 of FIG. 3, FIG. 10 illustrates a perspective view of the first area 402 of the memory device 400 in which a plurality of first area WLs 1002 (sometimes referred to as gate terminals) formed in the first cavities 904 (FIG. 9) located in the first area trenches 902, in accordance with various embodiments. The exposed edges of the first area WLs 1002 may be etched back such that the edges of the first WLs 1002 facing the first area trenches 902 are axially aligned in the Z-direction with corresponding edges of the insulating layers 704 disposed adjacent thereto, as shown in FIG. 10. In some embodiments, a masking layer may be formed over the second area 404 to prevent the formation of WLs in the second area 404.

In various embodiments, the first area WLs 1002 are formed by filling a gate metal in the first cavities 904 (FIG. 9) over the optional adhesive layer, such that the first area WLs 1002 inherit the dimensions and profiles of the first cavities 904. The first area WLs 1002 can be formed by filling the first cavities with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The first area WLs 1002 can be formed by overlaying the workpiece with the above-listed metal material by, for example, chemical vapor deposition (CVD), physical vapor deposition (PVD), electroless plating, electroplating, any other suitable method, or combinations thereof.

Although each first area WL 1002 shown in FIG. 10 is shown as a single layer, the word line material may include a stack of multiple metal materials. For example, the word line material may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ (sometimes referred to as $V_{th}$) is achieved in the device that is to be formed. The work function layer(s) may be deposited by CVD, physical vapor deposition (PVD), ALD, and/or other suitable processes.

Formation of the first area WLs 1002 in the first cavities 904 (FIG. 9) may cause edges of the first area WLs 1002 in the X-direction to protrude outwards of the first cavities 904 (FIG. 9), i.e., outwards of the corresponding edges of the insulating layers 704, and/or the material forming the first area WLs 1002 may also be deposited on exposed surfaces of the insulating layers 704 that face the first area trenches 902 and/or the etch stop layer 401. The protruding edges of the first area WLs 1002 are etched, for example, using a selective wet etching or dry etching process (e.g., RIE, DRIE, etc.) until any gate material deposited on the surfaces of the insulating layers 704 and/or the etch stop layer 401, and edges of the first area WLs 1002 facing the first area trenches 902 are substantially axially aligned with corresponding edges of the insulating layers 704.

Figure 11:
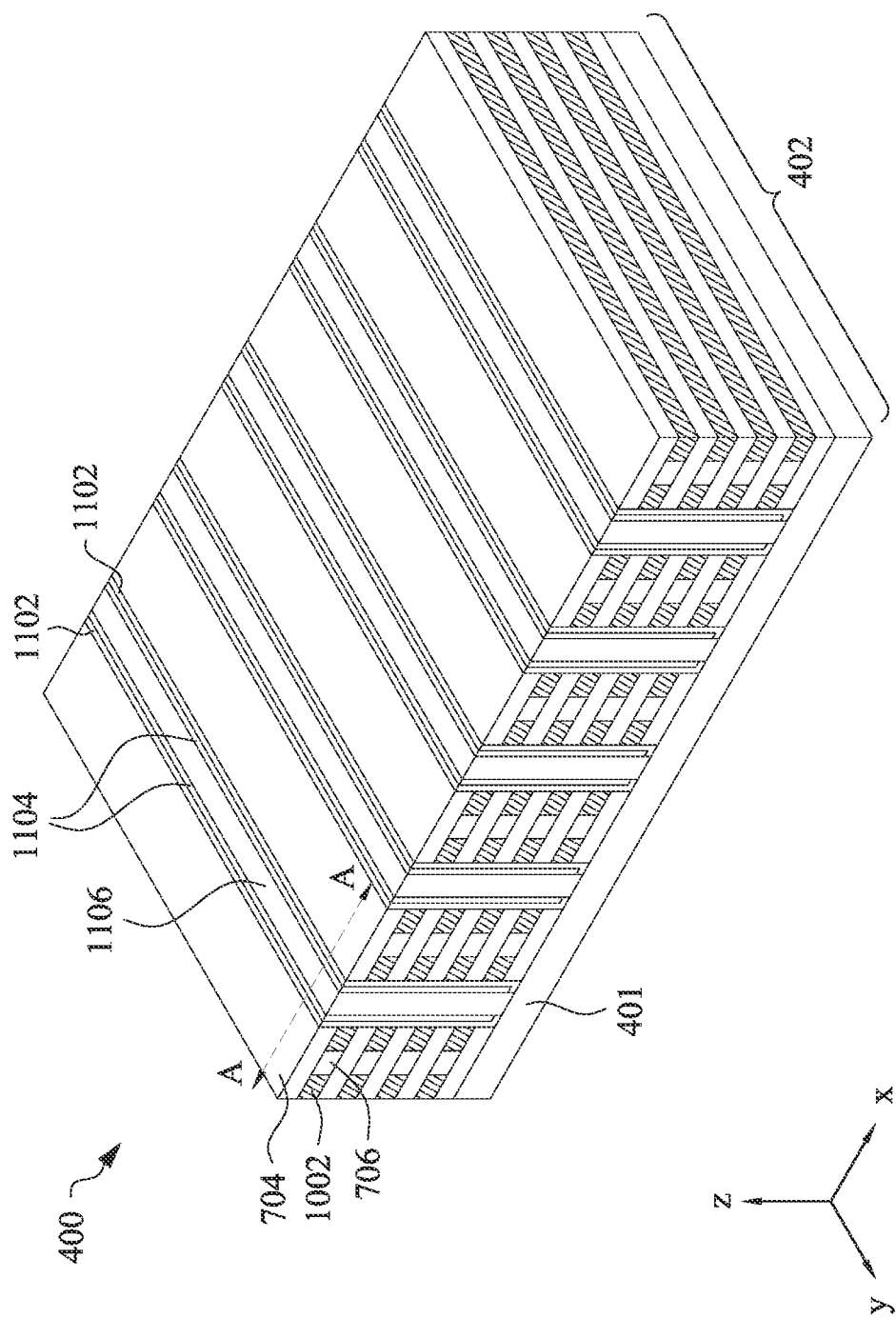
Figure 12:
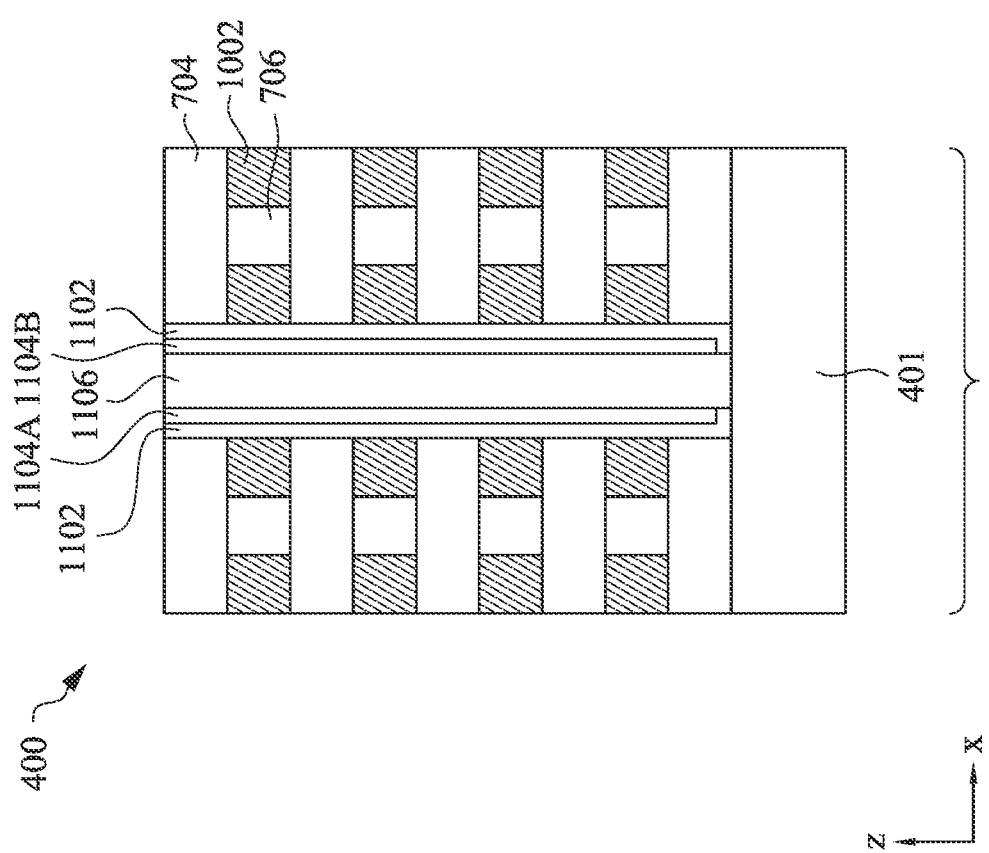
FIG. 12 illustrates a cross-sectional view of a first area of a 3D memory device during a stage of fabrication, in accordance with some embodiments.

Corresponding to operation 312 of FIG. 3, FIGS. 11 and 12 are a perspective view and a cross-sectional view cut along A-A of FIG. 11, respectively, of the first area 402 of the memory device 400 in which a plurality of first area memory layers 1102, a plurality of first area semiconductor channel layers 1104, and first area insulation layers 1106 are formed in each of the plurality of first area trenches 902 (FIG. 10), in accordance with some embodiments. The plurality of first area memory layers 1102, the plurality of first area semiconductor channel layers 1104, and the first area insulation layers 1106 may continuously extend along the Y-direction. In some embodiments, a masking layer may be formed over the second area 404 to prevent the formation of memory layers, semiconductor channel layers, and insulation layers in the second area 404.

As shown in FIG. 11, the plurality of first area memory layers 1102 are formed and continuously extend along the Y-direction. The first area memory layers 1102 may include a ferroelectric material, for example, lead zirconate titanate (PZT), PbZr/TiO$_3$, BaTiO$_3$, PbTiO$_2$, or combinations thereof, etc. However, it should be understood that the first area memory layers 1102 can include any of various other materials that are suitable as in memory devices, while remaining within the scope of the present disclosure. For example, the first area memory layers 1102 can include a material selected from the group consisting of: HfO$_2$, Hr$_{1-x}$Zr$_x$O$_2$, ZrO$_2$, TiO$_2$, NiO, TaO$_x$, Cu$_2$O, Nb$_2$O$_5$, AlO$_x$, and combinations thereof. The first area memory layers 1102 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof. A conformal coating may be deposited such that the first area memory layers 1102 are continuous on the walls of the first area trenches 902 (FIG. 10) in the Z-direction. In some embodiments, a CMP operation may be performed after forming the first area memory layers 1102 so that they will lie in the same X-Y plane or are level with a top surface of the topmost insulating layer 704. In various embodiments, each of the first area memory layers 1102 includes two portions, each of which is formed to extend along one of the sidewalls of a corresponding trench, as shown in FIG. 12. As such, each portion of the memory layer is in contact with a corresponding number of first area WLs 1002 (through their respective exposed sidewalls). In some embodiments, each first area memory layer 1102 includes a vertical portion and a lateral portion along the X-direction that does not continuously extend along the first area trench 902 (FIG. 10), as shown in FIG. 12. After formation, the first area memory layers 1102 may sometimes be referred to as first memory films.

Then, the plurality of first area semiconductor channel layers 1104 are formed within each of the plurality of first area trenches 902 (FIG. 10) on exposed surfaces of the plurality of first area memory layers 1102 such that the plurality of first area semiconductor channel layers 1104 continuously extend along the Y-direction. In some embodiments, the first area semiconductor channel layers 1104 may be formed from a semiconductor material, for example, silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. The first area semiconductor channel layers 1104 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof. A conformal coating may be deposited such that the first area semiconductor channel layers 1104 are continuous on the inner surface of the first area memory layers 1102. In some embodiments, a CMP operation may be performed after forming the first area semiconductor channel layers 1104 so that they will lie in the same X-Y plane or are level with a top surface of the topmost insulating layer 704. Over the memory layer, each of the first area semiconductor channel layers 1104 also includes two portions that are in contact with the two portions of a corresponding first area memory layer 1102, respectively.

As shown in FIG. 12, the first area semiconductor channel layers 1104 may be etched along the X-direction so that one portion of the first area semiconductor channel layer 1104A is not in contact with another portion of the first area semiconductor channel layer 1104B in order to prevent the shorting of the SLs and BLs that are later formed. The first area semiconductor channel layers 1104 may be etched by any suitable etching process, such as a plasma etching process (including radical plasma etching, remote plasma etching, and other suitable plasma etching processes, RIE, DRIE), gas sources such as Cl$_2$, HBr, CF$_4$, CHF$_3$, CH$_2$F$_2$, CH$_3$F, C$_4$F$_6$, BCl$_3$, SF$_6$, H$_2$, NF$_3$, and other suitable etch gas sources and combinations thereof can be used with passivation gases such as N$_2$, O$_2$, CO$_2$, SO$_2$, CO, CH$_4$, SiCl$_4$, and other suitable passivation gases and combinations thereof. Each first area WL 1002 is electrically coupled to a first area semiconductor channel layer 1104 with a first area memory layer 1102 interposed therebetween.

Then, the plurality of first area insulation layers 1106 are formed within each of the plurality of first area trenches 902 (FIG. 10) by filling each of the plurality of first area trenches 902 with an insulating material such that the first area memory layers 1102, the first area semiconductor channels 1104, and the first area insulation layers 1106 are formed in the memory device 400 and extend in the Y-direction parallel to each other.

Each of the trenches is filled with an insulating material (e.g., SiO$_2$, SiN, SiON, SiCN, SiC, SiOC, SiOCN, the like, other suitable materials, or combinations thereof) so as to form the first area insulation layers 1106. In some embodiments, the first area insulation layers 1106 may be formed from the same material as the plurality of insulating layers 704 (e.g., SiO$_2$). The first area insulation layers 1106 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof, a high aspect ratio process (HARP), another applicable process, or combinations thereof. A CMP process may then be performed after forming the first area insulation layers 1106 so that they will lie in the same X-Y plane or are level with a top surface of the topmost insulating layer 704.

Figure 13:
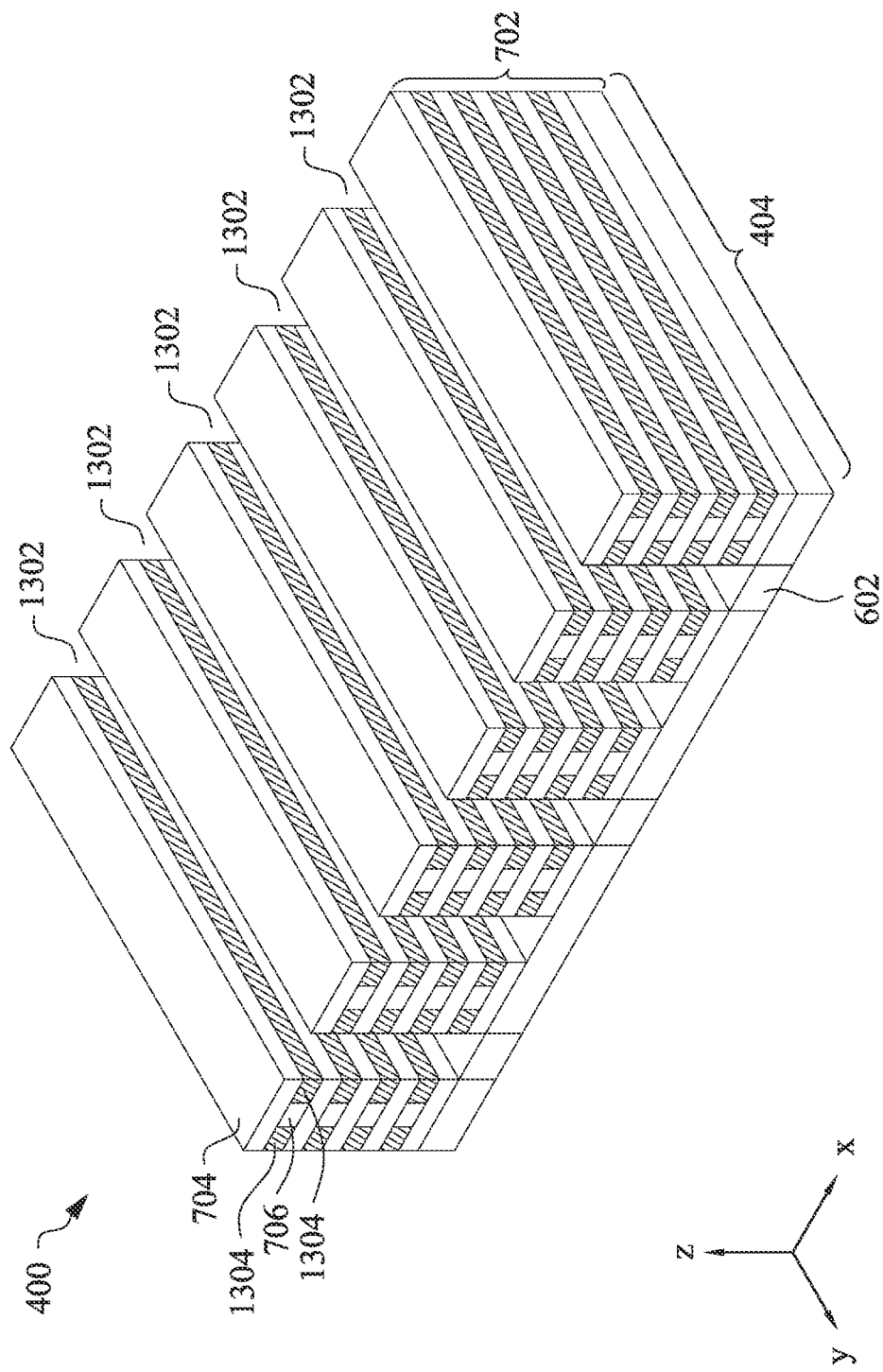

Corresponding to operations 314-316 of FIG. 3, FIG. 13 is a perspective view of the second area 404 of the memory device 400 with a plurality of second area trenches 1302 formed and extending in the Y-direction and a plurality of second area WLs 1304 (sometimes referred to as gate terminals) formed, in accordance with some embodiments. Although five second area trenches 1302 are shown in the embodiment of FIG. 13, it should be understood that the memory device 400 can include any number of second area trenches while remaining within the scope of the present disclosure. In some embodiments, a masking layer may be formed over the first area 402 to prevent the additional formation of trenches and WLs in the first area 402.

The plurality of second area trenches 1302 extending in the Y-direction, have been formed through the stack 702 up to the etch stop layer 401 by etching the stack 702 in the Z-direction. The second area trenches 1302 may be formed to expose the second area SLs 602. In some embodiments, the width of the second area trenches 1302 in the X-direction is equal to the width of the second area SLs 602 in the X-direction. The etching process for forming the plurality of second area trenches 1302 may include a plasma etching process, which can have a certain amount of anisotropic characteristic. For example, the second area trenches 1302 may be formed, for example, by depositing a photoresist or other masking layer on a top surface of the memory device 400, i.e., the top surface of the topmost insulating layer 704 of the stack 702, and a pattern corresponding to the second area trenches 1302 defined in the masking layer (e.g., via photolithography, e-beam lithography, or any other suitable lithographic process).

The second area trenches 1302 may be formed using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second area trenches 1302.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. As shown in FIG. 13, the etch used to form the plurality of second area trenches 1302 etches through each of the sacrificial layers 706 and insulating layers 704 of the stack 702 such that each of the plurality of second area trenches 1302 extend from the topmost insulating layer 704 through the bottommost insulating layer 704 to the etch stop layer 401. In other embodiments, a hard mask may be used. In some embodiments, the second area trenches 1302 may be formed with a varying width along, the Y-direction. In some embodiments, the second area trenches 1302 may be etched with an increasing width as the height of second area trench 1302 increases in the Z-direction.

Then, the exposed surfaces of the sacrificial layers 706 within the second area trenches 1302 are partially etched so as to reduce a width of the sacrificial layers 706 relative to the insulating layers 704 in the stack 702. The exposed surfaces extend in the Y-direction. In some embodiments, the sacrificial layers 706 may be etched using a wet etch process (e.g., hydrofluoric etch, buffered hydrofluoric acid). In other embodiments, the exposed surfaces of the sacrificial layers 706 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the sacrificial layers 706 in the X-direction reduces a width of the sacrificial layers 706 relative to the insulating layers 704 disposed in the stack 702 such that second cavities are formed whose boundaries are formed by top and bottom surfaces of adjacent insulating layers 704 and a surface of the partially etched sacrificial layers 706 that face the second area trenches 1302 and extend in the Y-direction.

In some embodiments, an adhesive layer is then formed on sidewalls of the second cavities. In some embodiments, the adhesive layer is optional. In various embodiments, the adhesive layers may include a material that has good adhesion with each of the insulating layers 704, the sacrificial layers 706, and the soon-to-be formed first area WLs, for example, Ti, Cr, etc. In some embodiments, the adhesive layer may include e.g., titanium (Ti), chromium (Cr), or any other suitable adhesive material. The adhesive layers may be deposited using any suitable method including, for example, molecular beam deposition (MBD), atomic layer deposition (ALD), PECVD, and the like. In some embodiments, the adhesive layer may have a thickness in a range of 0.1 nm to 5 nm, inclusive or any other suitable thickness.

Then, the second area WLs 1104 are formed by filling a gate metal in the second cavities over the optional adhesive layer, such that the second area WLs 1304 inherit the dimensions and profiles of the second cavities. The second area WLs 1304 can be formed by filling the first cavities with a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The second area WLs 1304 can be formed by overlaying the workpiece with the above-listed metal material by, for example, chemical vapor deposition (CVD), physical vapor deposition (PVD), electroless plating, electroplating, any other suitable method, or combinations thereof.

Although each second area WL 1304 shown in FIG. 10 is shown as a single layer, the word line material may include a stack of multiple metal materials. For example, the word line material may be a p-type work function layer, an n-type work function layer, multi-layers thereof, any other suitable material, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ (sometimes referred to as $V_{th}$) is achieved in the device that is to be formed. The work function layer(s) may be deposited by CVD, physical vapor deposition (PVD), ALD, and/or other suitable processes.

Formation of the second area WLs 1304 in the second cavities may cause edges of the second area WLs 1304 in the X-direction to protrude outwards of the second cavities, i.e., outwards of the corresponding edges of the insulating layers 704, and/or the material forming the second area WLs 1304 may also be deposited on exposed surfaces of the insulating layers 704 that face the second area trenches 1302 and/or the etch stop layer 401. The protruding edges of the second area WLs 1304 are etched, for example, using a selective wet etching or dry etching process (e.g., RIE, DRIE, etc.) until any gate material deposited on the surfaces of the insulating layers 704 and/or the etch stop layer 401, and edges of the second area WLs 1304 facing the second area trenches 1302 are substantially axially aligned with corresponding edges of the insulating layers 704.

Figure 14:
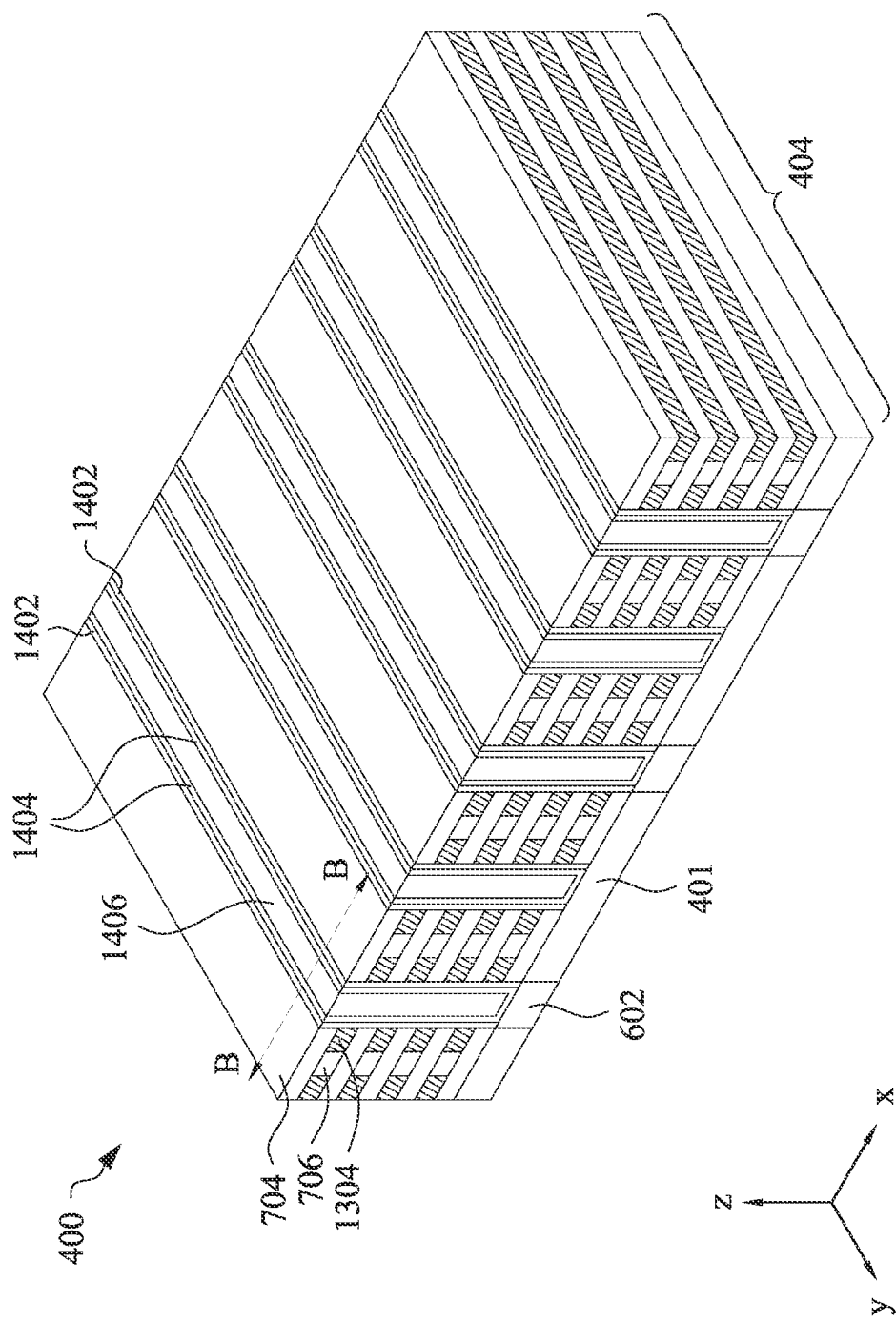
Figure 15:
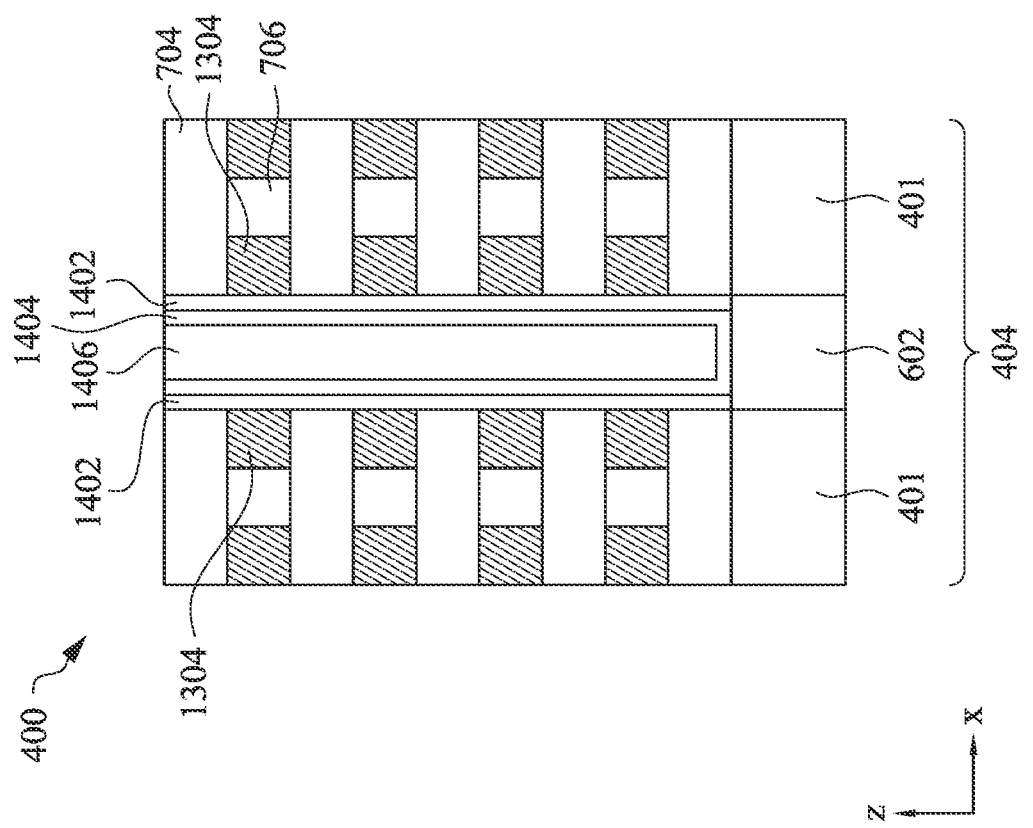
FIG. 15 illustrates a cross-sectional view of a second area of a 3D memory device during a stage of fabrication, in accordance with some embodiments.

Corresponding to operation 318 of FIG. 3, FIGS. 14 and 15 are a perspective view and a cross-sectional view cut along B-B of FIG. 14, respectively, of the second area 404 of the memory device 400 in which a plurality of second area memory layers 1402, a plurality of second area semiconductor channel layers 1404, and second area insulation layers 1406 are formed in each of the plurality of the second area trenches 1302 (FIG. 13), in accordance with some embodiments. The plurality of second area memory layers 1402, the plurality of second area semiconductor channel layers 1404, and the second area insulation layers 1406 may continuously extend along the Y-direction. In some embodiments, a masking layer may be deposited over the first area 402 to prevent the additional formation of memory layers, semiconductor channel layers, and insulation layers in the first area 402.

As shown in FIG. 14, the plurality of second area memory layers 1402 are formed and continuously extend along the Y-direction. The second area memory layers 1402 may include a ferroelectric material, for example, lead zirconate titanate (PZT), PbZr/TiO$_3$, BaTiO$_3$, PbTiO$_2$, or combinations thereof, etc. However, it should be understood that the second area memory layers 1402 can include any of various other materials that are suitable as in memory devices, while remaining within the scope of the present disclosure. For example, the second area memory layers 1402 can include a material selected from the group consisting of: HfO$_2$, Hr$_{1-x}$Zr$_x$O$_2$, ZrO$_2$, TiO$_2$, NiO, TaO$_x$, Cu$_2$O, Nb$_2$O$_5$, AlO$_x$, and combinations thereof. The second area memory layers 1402 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof. A conformal coating may be deposited such that the second area memory layers 1402 are continuous on the walls of the second area trenches 1302 (FIG. 13) in the Z-direction. In some embodiments, a CMP operation may be performed after forming the second area memory layers 1402 so that they will lie in the same X-Y plane or are level with a top surface of the topmost insulating layer 704. In various embodiments, each of the second area memory layers 1402 includes two portions, each of which is formed to extend along one of the sidewalls of a corresponding trench, as shown in FIG. 15. As such, each portion of the memory layer is in contact with a corresponding number of second area WLs 1304 (through their respective exposed sidewalls). After formation, the second area memory layers 1402 may sometimes be referred to as second memory films.

Then, the plurality of second area semiconductor channel layers 1404 are formed within each of the plurality of second area trenches 1302 (FIG. 13) on exposed surfaces of the plurality of second area memory layers 1402 and the second area SL 602 such that the plurality of second area semiconductor channel layers 1404 continuously extend along the Y-direction. The second area semiconductor channel layers 1404 comprise: (i) a first vertical portion coupled to both portions of the corresponding second area memory layer 1402; and (ii) a lateral portion along the X-direction coupled to a top surface of the second area SL 602. In some embodiments, the second area semiconductor channel layers 1402 may be formed from a semiconductor material, for example, silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. The second area semiconductor channel layers 1402 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof. A conformal coating may be deposited such that the second area semiconductor channel layers 1404 are continuous on the inner surface of the second area memory layers 1402 and the top surface of the second area SLs 602. In some embodiments, a CMP operation may be performed after forming the second area semiconductor channel layers 1404 so that they will lie in the same X-Y plane or are level with a top surface of the topmost insulating layer 704. Each second area WL 1304 is electrically coupled to a second area semiconductor channel layer 1404 with a second area memory layer 1402 interposed therebetween.

Then, the plurality of second area insulation layers 1406 are formed within each of the plurality of second area trenches 1302 (FIG. 13) by filling each of the plurality of second area trenches 1302 with an insulating material such that the second area memory layers 1402, the second area semiconductor channels 1404, and the second area insulation layers 1406 are formed in the memory device 400 and extend in the Y-direction parallel to each other.

Each of the trenches is filled with an insulating material (e.g., SiO$_2$, SiN, SiON, SiCN, SiC, SiOC, SiOCN, the like, other suitable materials, or combinations thereof) so as to form the second area insulation layers 1406. In some embodiments, the second area insulation layers 1406 may be formed from the same material as the plurality of insulating layers 704 (e.g., SiO$_2$). The second area insulation layers 1406 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process, or a combination thereof, a high aspect ratio process (HARP), another applicable process, or combinations thereof. A CMP process may then be performed after forming the second area insulation layers 1406 so that they will lie in the same X-Y plane or are level with a top surface of the topmost insulating layer 704.

Figure 16:
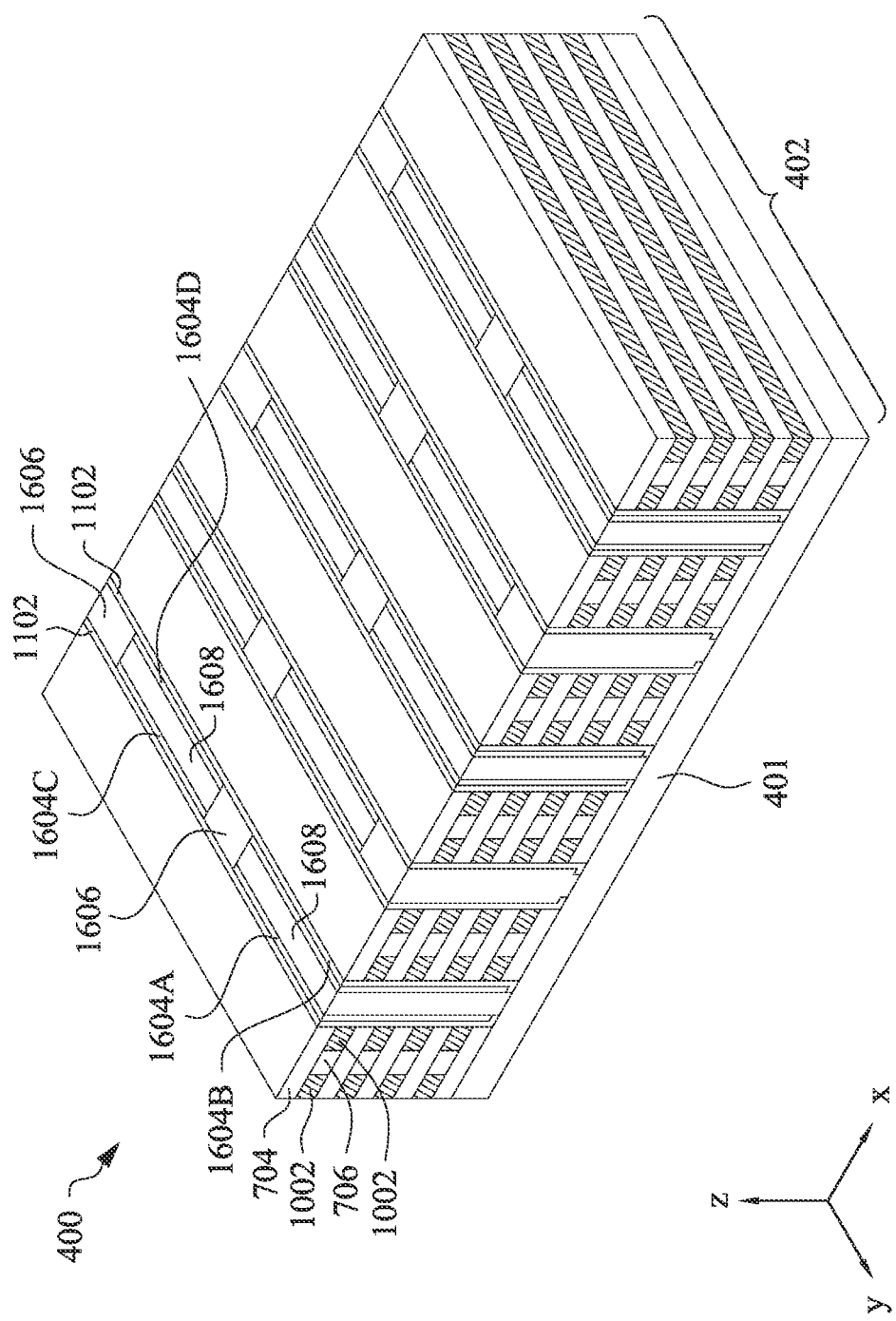
Figure 17:
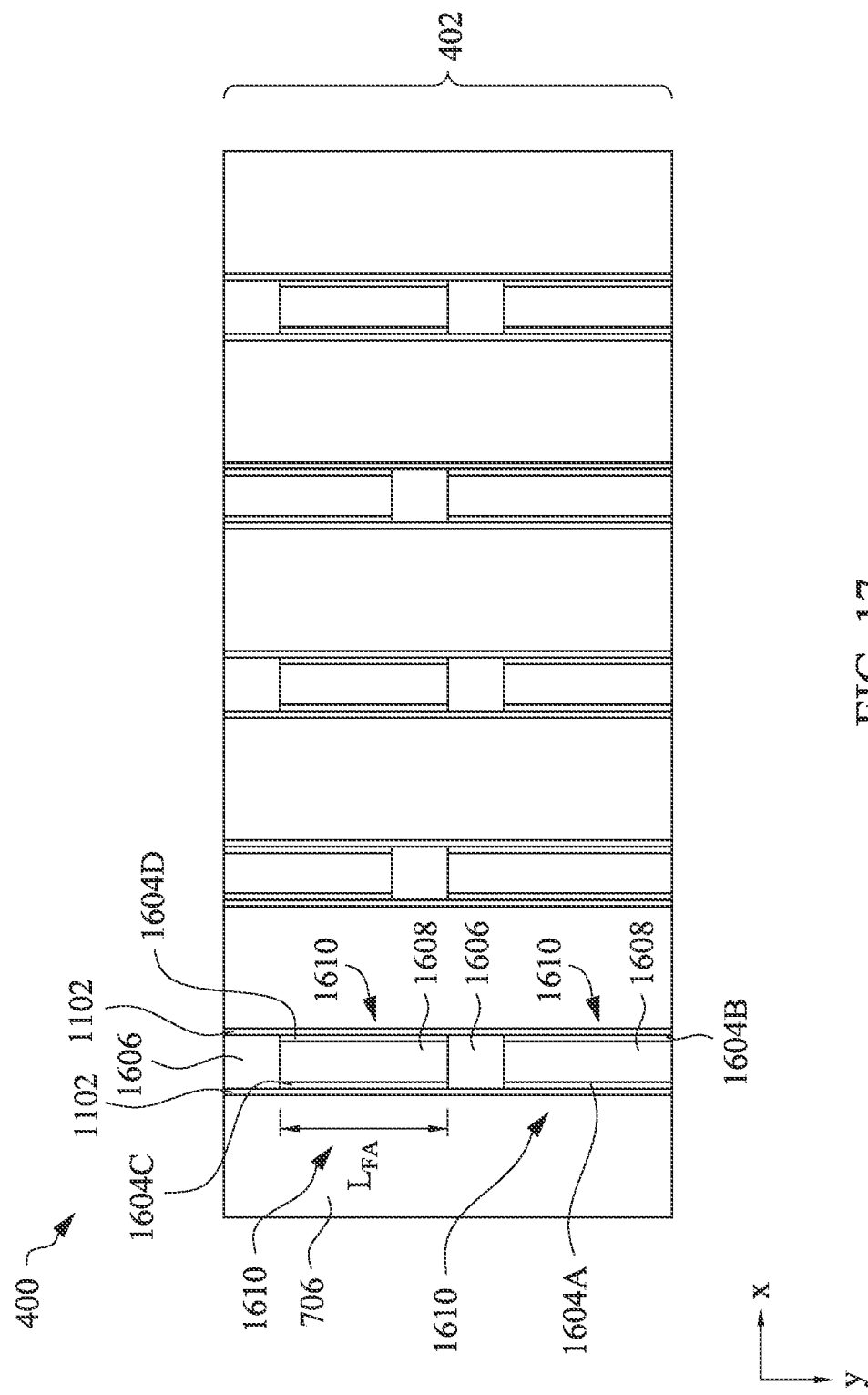
FIG. 17 illustrates a top view of a first area of a 3D memory device during a stage of fabrication, in accordance with some embodiments.

Corresponding to operation 320 of FIG. 3, FIGS. 16 and 17 illustrate a perspective view and a top view, respectively, of the first area 402 of the memory device 400 in which the plurality of first area semiconductor channel layers 1104 (FIG. 11) are patterned along the Y-direction to form first area semiconductor channels 1604A-D (sometimes referred to as semiconductor channel films), first area isolation structures 1606, and first area inner spacers 1608, in accordance with various embodiments.

As shown in FIG. 16, each first area semiconductor channel layers 1104 (FIG. 11) are patterned by, for example, an anisotropic etching process to form a number of first area channel films 1604A, 1604B, 1604C, and 1604D. It is understood that four first area channel films are shown in FIGS. 16 and 17, but any suitable number of first area channel films can be formed. Other methods of patterning the first area semiconductor channel layers 1104 are within the scope of the present disclosure. As shown in FIG. 17, each of the first area channel films 1604A-D may extend along the Y-direction with a length ($L_{FA}$), which may be configured to define the physical channel length of a memory cell. Each channel film defines the initial footprint of a memory string. Thus, a plurality of partially-formed first area memory cells 1610 that include the first area memory layers 1102, the first area semiconductor channels 1604A-D, and the insulation layers are formed in the memory device 400, and extend in the Y-direction parallel to each other.

The first area isolation structures 1606 are formed to separate the first area semiconductor channels 1604A-D into portion such that the first area semiconductor channels 1604A-D are included in each partially-formed first area memory cell 1610 and fill any cavities formed from the patterning. Each partially-formed first area memory cell 1610 includes a first area inner spacer 1608 formed from a portion of the insulation layer extending between adjacent first area isolation structures 1606 in the Y-direction, in accordance with some embodiments. The first area semiconductor channels 1604A-D are disposed on outer surfaces of the first area inner spacers 1608 in the Y-direction.

Figure 18:
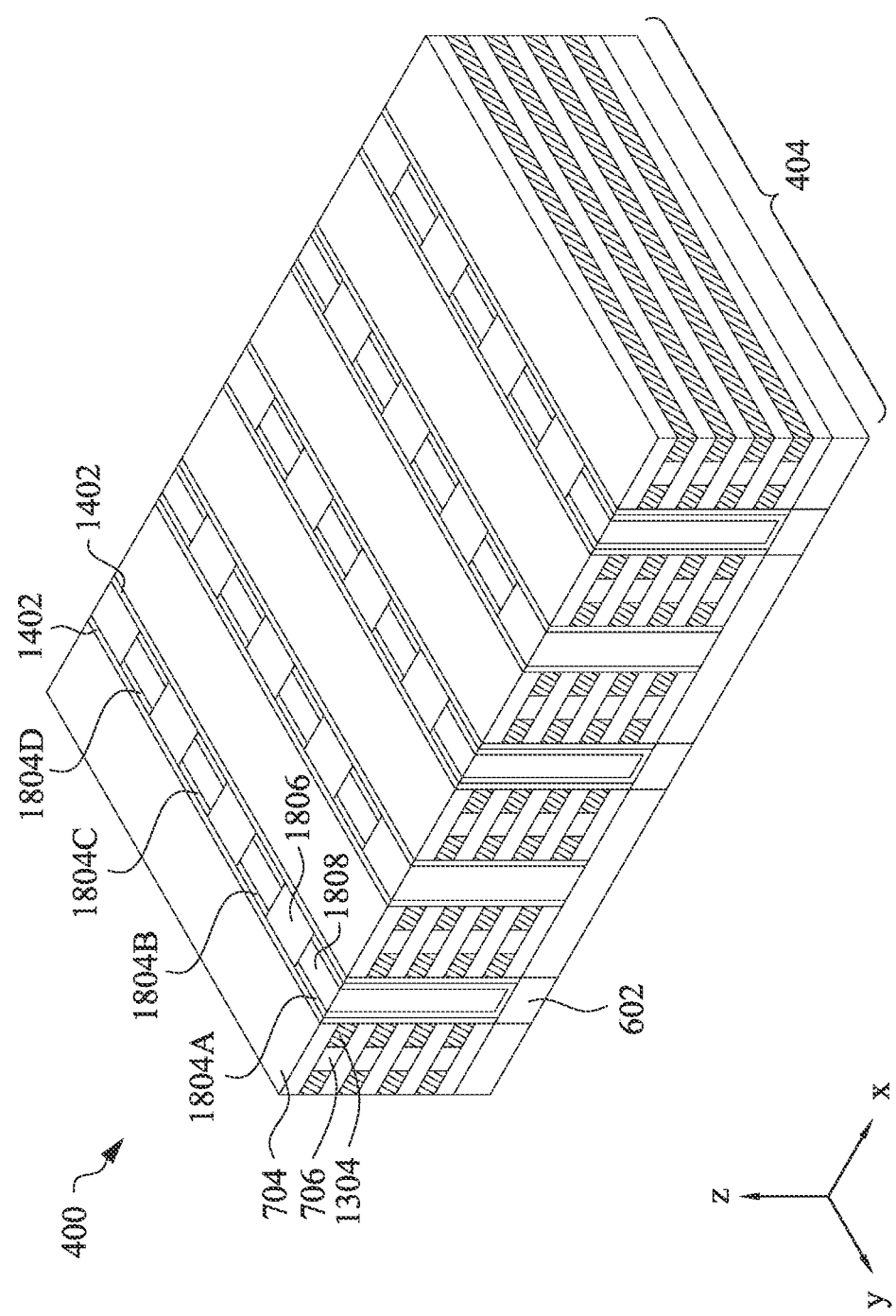
Figure 19:
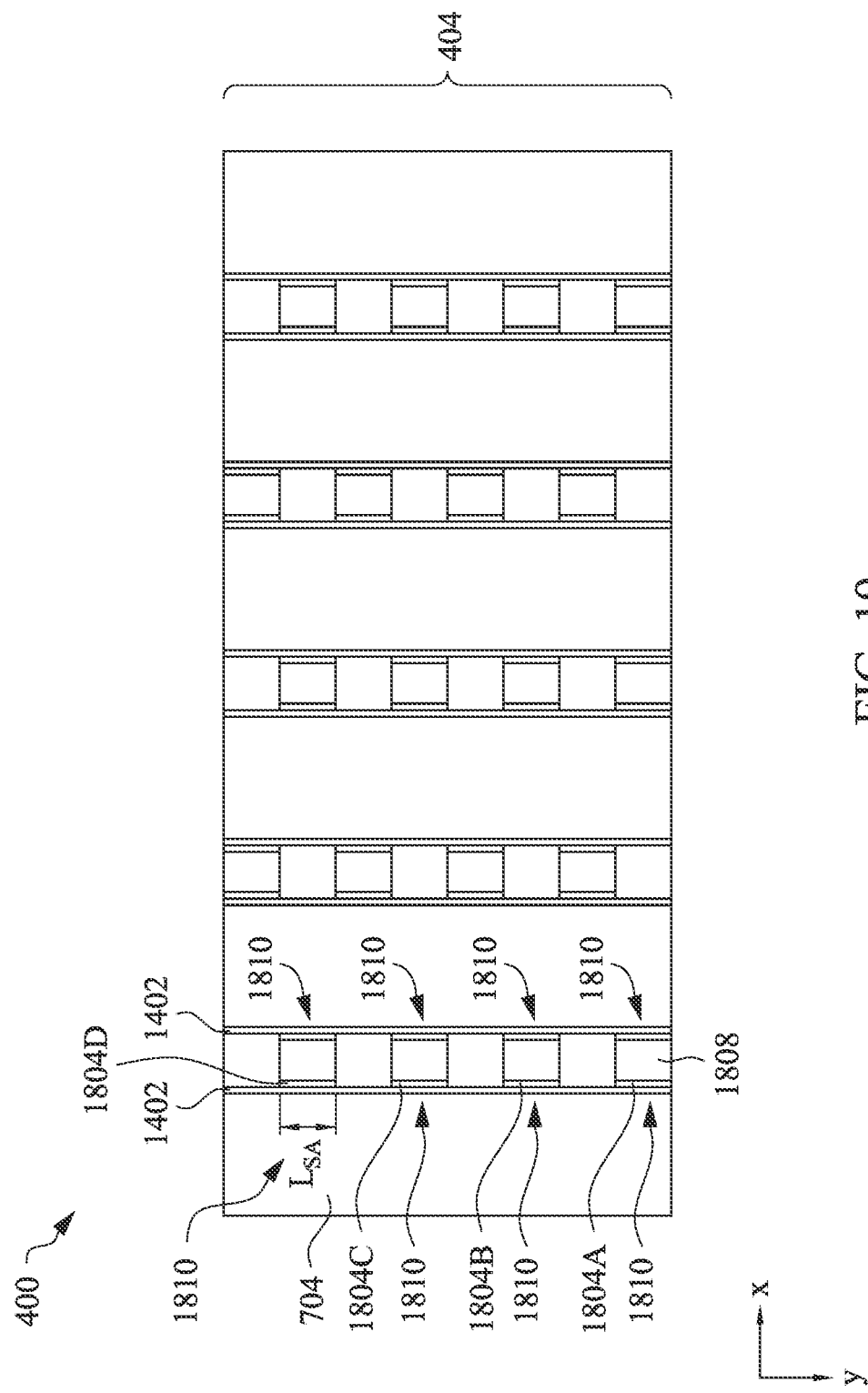
FIG. 19 illustrates a top view of a second area of a 3D memory device during a stage of fabrication, in accordance with some embodiments.

Also corresponding to operation 320 of FIG. 3, FIGS. 18 and 19 illustrate a perspective view and a top view, respectively, of the second area 404 of the memory device 400 in which the plurality of second area semiconductor channel layers 1404 (FIG. 14) are patterned along the Y-direction to form second area semiconductor channels 1804A-D (sometimes referred to as semiconductor channel films), second area isolation structures 1806, and second area inner spacers 1808, in accordance with various embodiments.

As shown in FIG. 18, each second area semiconductor channel layers 1404 (FIG. 14) are patterned by, for example, an anisotropic etching process to form a number of second area channel films 1804A, 1804B, 1804C, and 1804D. The second area channel films 1804A-D may be formed concurrently with the first area channel films 1604A-D. It is understood that four second area channel films are shown in FIGS. 18 and 19, but any suitable number of second area channel films can be formed. In some embodiments, the number of second area channel films may be equal that of the number of first area channel films. Other methods of patterning the second area semiconductor channel layers 1404 are within the scope of the present disclosure. As shown in FIG. 19, each of the second area channel films 1804A-D may extend along the Y-direction with a length ($L_{SA}$), which may be configured to define the physical channel length of a memory cell. Each channel film defines the initial footprint of a memory string. Thus, a plurality of partially-formed second area memory cells 1810 that include the second area memory layers 1402, the second area semiconductor channels 1804A-D, and the insulation layers are formed in the memory device 400, and extend in the Y-direction parallel to each other.

The second area isolation structures 1806 are formed to separate the first area semiconductor channels 1804A-D into portion such that the second area semiconductor channels 1804A-H are included in each partially-formed second area memory cell 1810 and fill any cavities formed from the patterning. Each partially-formed second area memory cell 1810 includes a second area inner spacer 1808 formed from a portion of the insulation layer extending between adjacent second area isolation structures 1806 in the Y-direction, in accordance with some embodiments. The second area semiconductor channels 1804A-D are disposed on outer surfaces of the second area inner spacers 1808 in the Y-direction.

Figure 20:
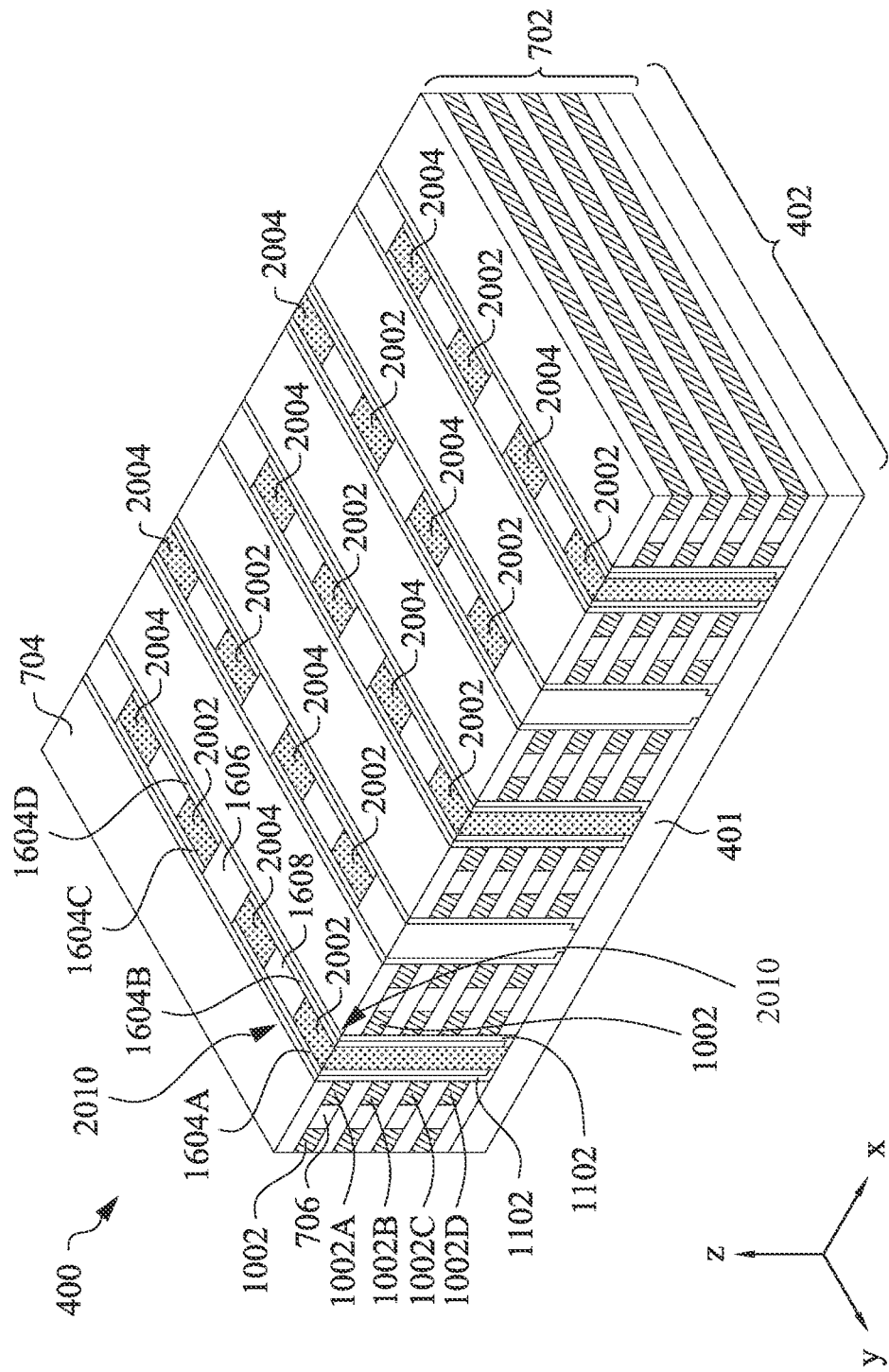

Corresponding to operation 322 of FIG. 3, FIG. 20 illustrates a perspective view of the first area 402 of the memory device 400 in which a plurality of first area SLs 2002 and a plurality of first area BLs 2004 are formed, in accordance with various embodiments. The first area SLs 2002 and the first area BLs 2004 extend vertically along the Z-direction and are spaced apart from each other in the Y-direction. In some embodiments, a SL or BL may sometimes be referred to as an access line. However, it should be understood that, in some embodiments, the SLs and the BLs may be coupled to different levels of (e.g., voltage) signals, when operating the memory device. In some embodiments, a masking layer may be deposited over the second area 404 to prevent the formation of additional SLs or BLs in the second area 404.

The first area inner spacers 1608 may be patterned to define initial footprints of a number of first area SLs 2002 and first area BLs 2004. The patterning generates trench portions by first etching through axial ends of the first area inner spacers 1608 to the etch stop layer 401. The axial ends of the first area inner spacers 1608 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

As shown in FIG. 20, the first area SLs 2002 and the first area BLs 2004 may then be formed, for example, using an epitaxial layer growth process to fill the trench portions with a continuously formed metal material such that the first area SLs 2002 and the first area BLs 2004 are located on opposite axial ends of the first area inner spacers 1608, each extending from the etch stop layer 401 to a top surface of the first area inner spacers 1608, as shown in FIG. 20. The first area SLs 2002 and the first area BLs 2004 may be formed in contact with end portions of a sidewall of the first area semiconductor channels 1604A-D. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. In some other embodiments, the first area SLs 2002 and the first area BLs 2004 may be formed with a continuously formed semiconductor material such as silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof.

The first area SLs 2002 and first area BLs 2004 can be formed by overlaying the workpiece (e.g., to fill the recesses) with the above-listed material by, for example, chemical vapor deposition (CVD), physical vapor deposition (PVD), electroless plating, electroplating, any other suitable methods, or combinations thereof. In some embodiments, a control deposition step may be performed for forming the first area SLs 2002 and the first area BLs 2004 such that the deposition step is stopped when a height of the first area SLs 2002 and the first area BLs 2004 in the Z-direction are equal to a height of the stack 702. In other embodiments, a CMP operation may be performed after formation of the first area SLs 2002 and the first area BLs 2004 so as to ensure a top surface of each of the topmost insulating layer 704, the first area memory layers 1102, the first area semiconductor channels 1604A-D, the first area inner spacers 1608, the first area SLs 2002, and the first area BLs 2004 lie in the same X-Y plane or are level with a top surface of the topmost insulating layer 704. In other embodiments, a top surface of the first area SLs 2002 and the first area BLs 2004 may be higher than a top surface of the topmost insulating layer 704. In some other embodiments, the top surface of the first area SLs 2002 and the first area BLs 2004 may be lower than the top surface of the topmost insulating layer 704.

Upon forming the first area SLs 2002 and first area BLs 2004, a number of first area memory cells 2010 may be formed (or otherwise defined), in accordance with various embodiments. Each of the first area SLs 2002 and each of the first area BLs 2004 are in contact with a respective one of the plurality of first area semiconductor channel films 1604A-D. Each of the first area semiconductor channel films 1604A-D is (e.g., electrically) coupled to a portion of each of the first area WLs 1002A-D. Each first area memory cell 2010 may be defined by such a portion of one of the WLs 1002A-D (which can function as its gate terminal), a portion of one of the first area semiconductor channel films 1604A-D, a portion of one of the first area memory layers 1102, one of the first area SLs 2002 (which can function as its source terminal), and one of the first area BLs 2004 (which can function as its drain terminal). These memory cells 2010, which share the same pair of first area SL and BL (and the same first area semiconductor channel film), may be vertically separated from one another to form a memory string. Alternatively stated, these memory cells 2010 of a single memory string are disposed in respective different memory levels. As such, the memory cells of such a memory string have their respective gate terminals (WLs) disposed in those different memory levels. In addition, a plurality of these memory strings can be laterally disposed with respect to one another to form a memory block or a memory array.

Figure 21:
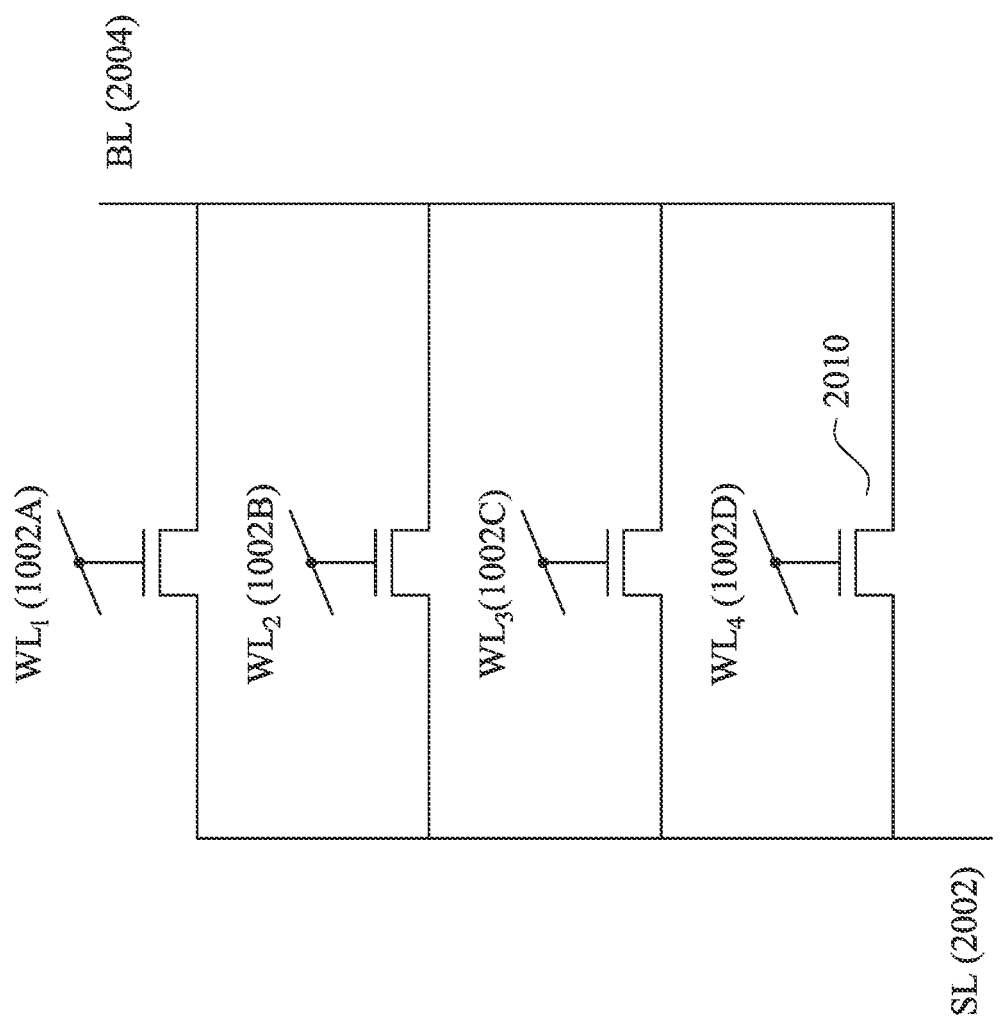
FIG. 21 illustrates a circuit diagram of a first area of a 3D memory device, in accordance with some embodiments.

In one embodiment, a memory string, constituted by a number of the memory cells 2010, may function as an AND memory string. FIG. 21 illustrates a circuit diagram representing such an AND memory string. As shown, four memory cells 2010, coupled to respective $WL_1$ to $WL_4$ (1002A to 1002D), share a same pair of BL (2004) and SL (2002). Specifically, each of the four memory cells 2010 has its own drain terminal coupled to the BL, its own source terminal coupled to the SL, and its own gate terminal coupled to a respective one of the $WL_1$ to $WL_4$. Alternatively stated, these four memory cells 2010 are coupled between the BL and SL in parallel. With such an electrical configuration, the AND memory string may be more suitable for high-speed computing.

Figure 22:
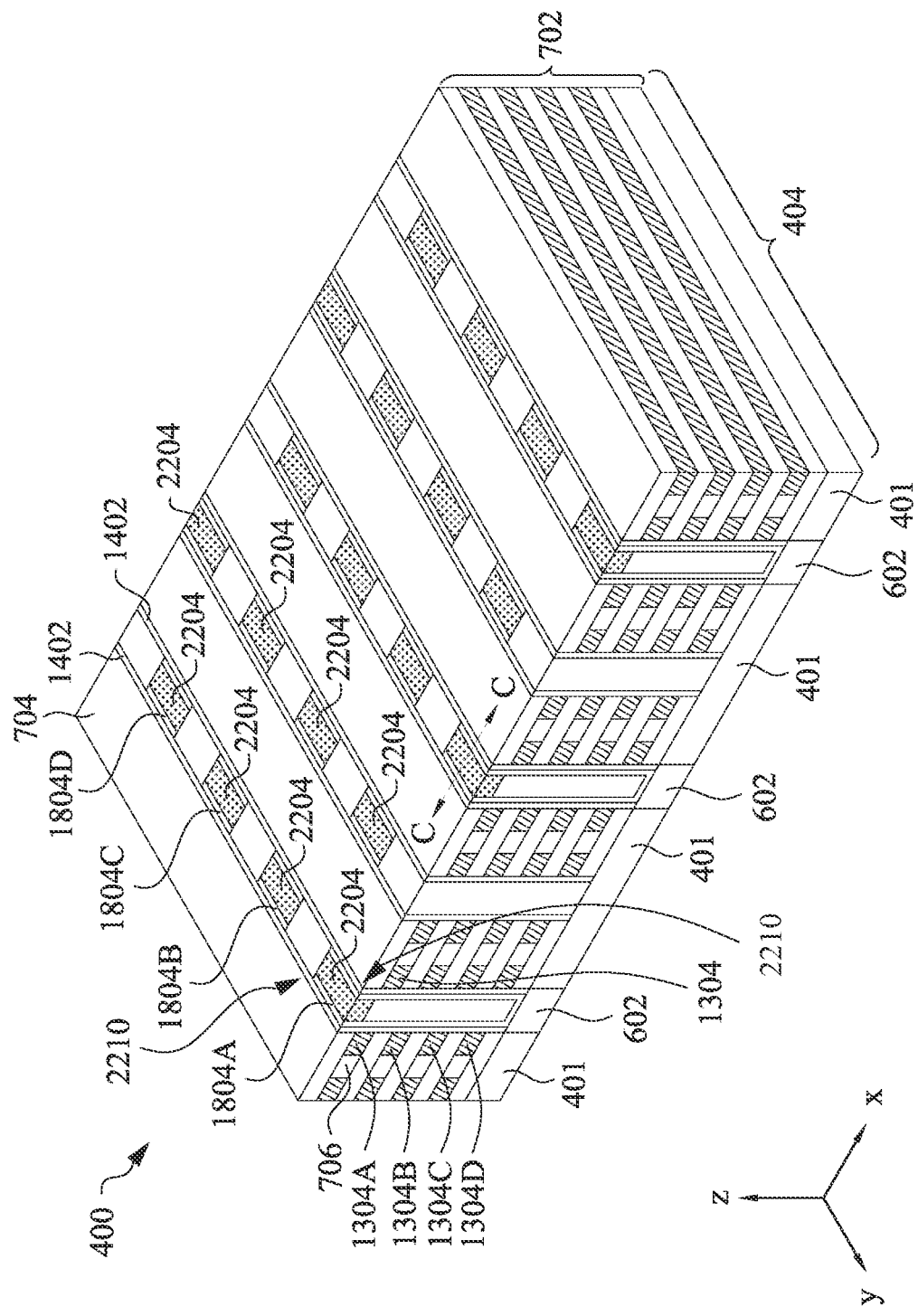

Corresponding to operation 324 of FIG. 3, FIG. 22 illustrate a perspective view of the second area 404 of the memory device 400 in which a plurality of second area BLs 2204 are formed, in accordance with various embodiments. The second area BLs 2204 are vertically spaced from the second area SLs 602 and coupled to an end portion of the second area semiconductor channels 1804A-D. In some embodiments, a masking layer may be deposited over the first area 402 to prevent the formation of additional BLs in the first area 402.

The second area inner spacers 1808 may be patterned to define initial footprints of a number of second area BLs 2204. The patterning generates cavities by first etching through axial ends of the second area inner spacers 1808 at a depth equal to or less than the height of the topmost insulating layer 704, as shown in FIG. 22. The axial ends of the second area inner spacers 1808 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof.

As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

As shown in FIG. 22, the second area BLs 2204 may then be formed, for example, using an epitaxial layer growth process to fill the cavities with a continuously formed metal material such that the second area BLs 2204 are located on opposite axial ends of the second area inner spacers 1808 (in FIG. 18), each extending from above the topmost second area WL 1304 to a top surface of the first area inner spacers 1608, as shown in FIG. 22. The second area BLs 2204 may be formed in contact with end portions of a sidewall of the second area semiconductor channels 1804A-D. The second area BLs 2204 may be disposed directly above the second area SLs 602. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. In some other embodiments, the second area BLs 2204 may be formed with a continuously formed semiconductor material such as silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof.

The second area BLs 2204 can be formed by overlaying the workpiece (e.g., to fill the recesses) with the above-listed material by, for example, chemical vapor deposition (CVD), physical vapor deposition (PVD), electroless plating, electroplating, any other suitable material, or combinations thereof. In some embodiments, a control deposition step may be performed for forming the second area BLs 2204 such that the deposition step is stopped when a height of the second area BLs 2204 in the Z-direction are equal to a height of the topmost insulating layer 704. In other embodiments, a CMP operation may be performed after formation of the second area BLs 2204 so as to ensure a top surface of each of the topmost insulating layer 704, the second area memory layers 1402, the second area semiconductor channels 1804A-H, the second area inner spacers 1808 (in FIG. 18), and the second area BLs 2204 lie in the same X-Y plane or are level with a top surface of the topmost insulating layer 704. In other embodiments, a top surface of the second area BLs 2204 may be higher than a top surface of the topmost insulating layer 704. In some other embodiments, the top surface of the second area BLs 2204 may be lower than the top surface of the topmost insulating layer 704.

Upon forming the second area BLs 2204, a number of second area memory cells 2210 may be formed (or otherwise defined), in accordance with various embodiments. Each of the second area BLs 2204 is in contact with a respective one of the plurality of second area semiconductor channel films 1804A-D. Each of the second area semiconductor channel films 1804A-D is (e.g., electrically) coupled to a portion of each of the second area WLs 1304A-D. In addition, each of the second area semiconductor channel films 1804A-D is (e.g., electrically) coupled to a respective one of the second area SLs 602. Each second area memory cell 2210 may be defined by such a portion of one of the WLs 1304A-D (which can function as its gate terminal), a portion of one of the second area semiconductor channel films 1804A-D, a portion of one of the second area memory layers 1402, one of the second area SLs 602 (which can function as its source terminal), and one of the second area BLs 2204 (which can function as its drain terminal). These memory cells 2210, which share the same pair of second area SL and BL (and the same vertical portion of the second area semiconductor channel film), may be vertically separated from one another to form a memory string. Alternatively stated, these memory cells 2210 of a single memory string are disposed in respective different memory levels. As such, the memory cells of such a memory string have their respective gate terminals (WLs) disposed in those different memory levels. In addition, a plurality of these memory strings can be laterally disposed with respect to one another to form a memory block or a memory array.

Figure 23:
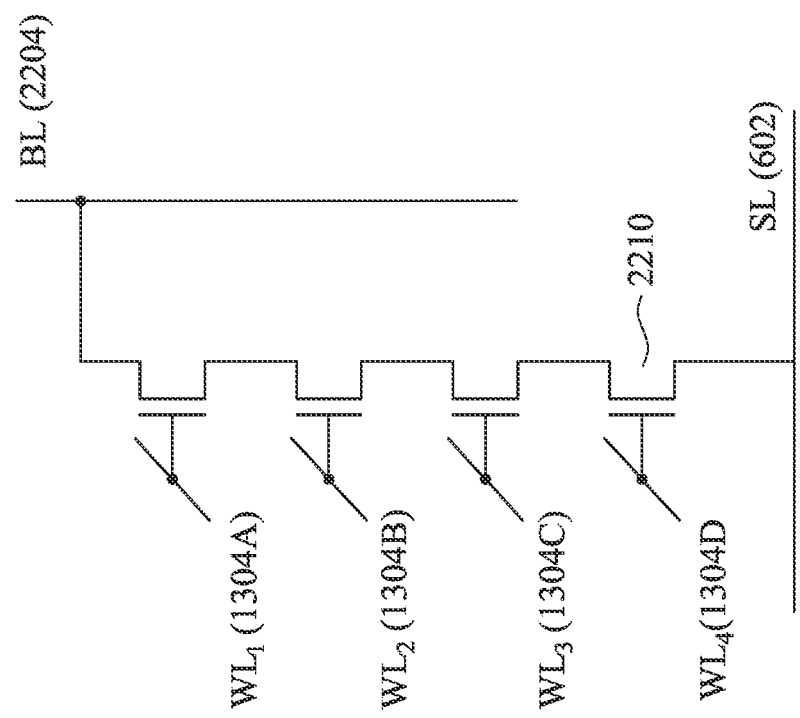
FIG. 23 illustrates a circuit diagram of a second area of a 3D memory device, in accordance with some embodiments.

In one embodiment, a memory string, constituted by a number of the memory cells 2210, may function as a NAND memory string. FIG. 23 illustrates a circuit diagram representing such a NAND memory string. As shown, four memory cells 2210, coupled to respective $WL_1$ to $WL_4$ (1304A to 1304D), share a same pair of BL (2204) and SL (602). Specifically, a topmost one of the four memory cells 2210 has its drain terminal coupled to the BL and its source terminal coupled to a drain terminal of a next lower memory cell 2210, and a bottommost one of the four memory cells 2210 has its source terminal coupled to the SL and its drain terminal coupled to a source terminal of a next upper memory cell 2210, while all four memory cells 2210 have their own gate terminals coupled to the $WL_1$ to $WL_4$, respectively. Alternatively stated, these four memory cells 2210 are coupled between the BL and SL in series. With such an electrical configuration, the NAND memory string may be more suitable for storing a high volume of data in a compact area.

To further illustrate the NAND memory strings in the second area 404, FIGS. 24, 25, 26, 27, and 28 illustrate cross-sectional views cut along C-C of the memory device 400 (FIG. 22), in accordance with various embodiments.

FIGS. 24-28 each illustrate one of the second area SLs 602, one of the second area BLs 2204, one of the second area channel films 1804A, portions of the second area memory layer 1402, a number of the second area WLs 1304, the insulating layers 704, and the etch stop layer 401. As the second area semiconductor channel layer 1404 (e.g., shown in FIG. 14) is not "cut" at its bottom lateral portion, and thus, each of the second area channel films (e.g., 1804A) has a lateral portion in contact with a respective second area SL 602. Stated another way, each second area channel film (e.g., 1804A) has a bottom surface in contact with a top surface of the corresponding second area SL 602.

Figure 24:
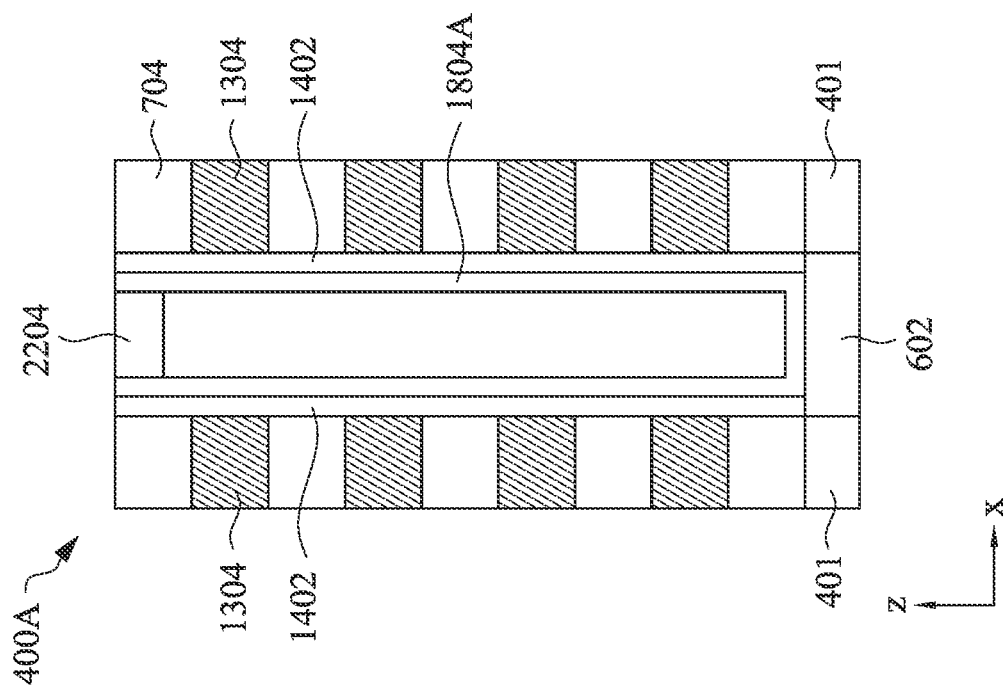
FIG. 24 illustrates a cross-sectional view of a second area of a 3D memory device during a stage of fabrication, in accordance with some embodiments.
Figure 27:
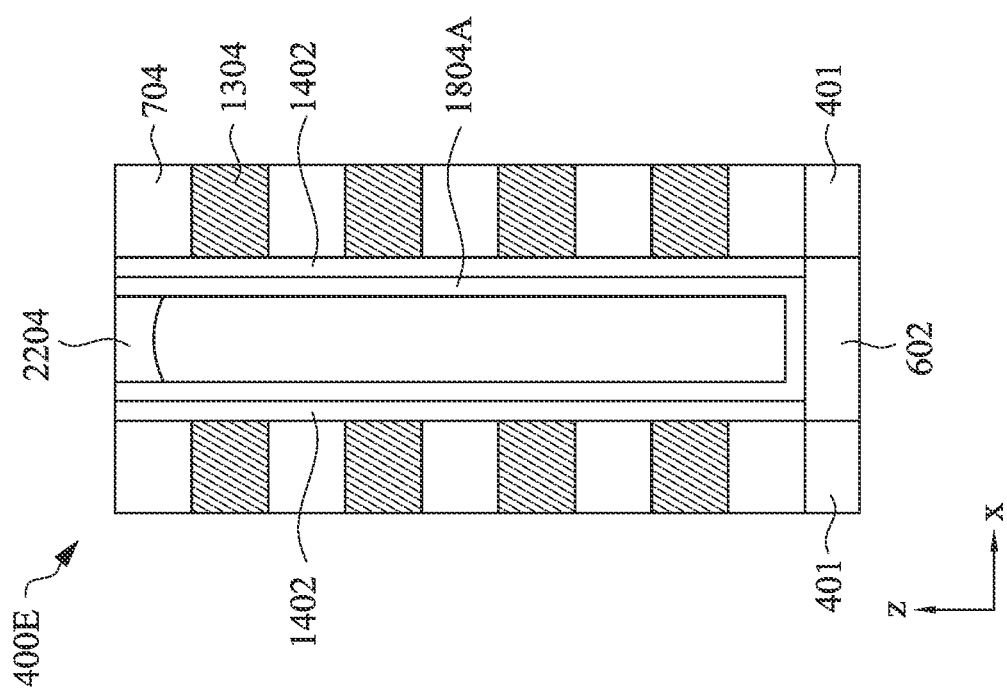
FIG. 27 illustrates a cross-sectional view of a second area of a 3D memory device during a stage of fabrication, in accordance with some embodiments.
Figure 28:
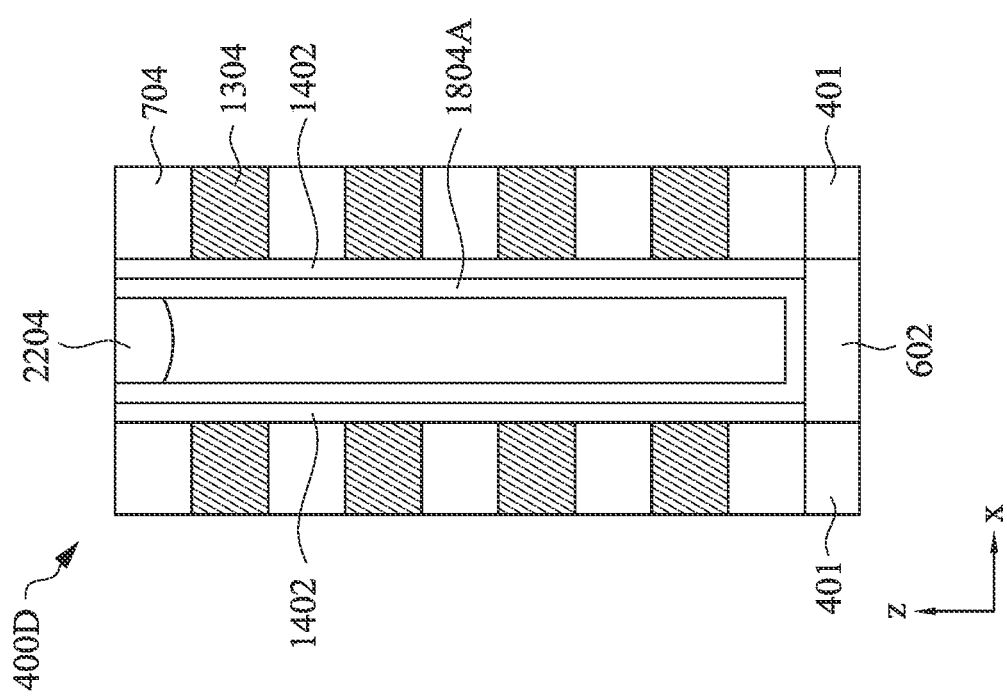
FIG. 28 illustrates a cross-sectional view of a second area of a 3D memory device during a stage of fabrication, in accordance with some embodiments.

Further, FIGS. 24, 27, and 28 illustrate that the second area SL 602 may extend in the X-direction beyond the bottom surface of the second area channel film 1804A to contact the second memory layers 1402. FIG. 25 illustrates an example where the second area SLs 602 may not extend in the X-direction beyond the bottom surface of the second area channel film 1804A such that the second area SL 602 may not contact the second memory layers 1402. Specifically, the top surface of the second area SL 602 may have a width (along the X-direction) similar to a width of the bottom surface of the second area channel film 1804A. FIG. 26 illustrates another example where the second area SLs 602 may not extend in the X-direction beyond the bottom surface of the second area channel film 1804A such that the second area SL 602 may not contact the second memory layers 1402. Specifically, the top surface of the second area SL 602 may have a width (along the X-direction) less than a width of the bottom surface of the second area channel film 1804A.

FIGS. 24, 25, and 26 illustrate that the bottom surface of the second area BL 2204 may be flat. FIG. 27 illustrates that the bottom surface of the second area BL 2204 may be curved or concave. FIG. 28 illustrates that the bottom surface of the second area BL 2204 may be curved or convex. It is understood that any combination of configurations of the second area SLs 602 and the second area BLs 2204 may be in the memory device 400. It is also understood that the first area SLs 2002 and the first area BLs 2004 in the first area 402 may also have the configurations of the second area BLs 2204 shown in FIGS. 24-28. In each embodiment, both the second area SLs 602 and the second area BLs 2204 in the second area 404 must be electrically coupled to the second area channel films 1804A-D. As stated previously, a memory cell in the second area 404 comprises a second area WL 1304, a portion of the second area channel film 1804A-D, a portion of the second area memory films 1402, the second area SL 602, and the second area BL 2204.

Figure 29:
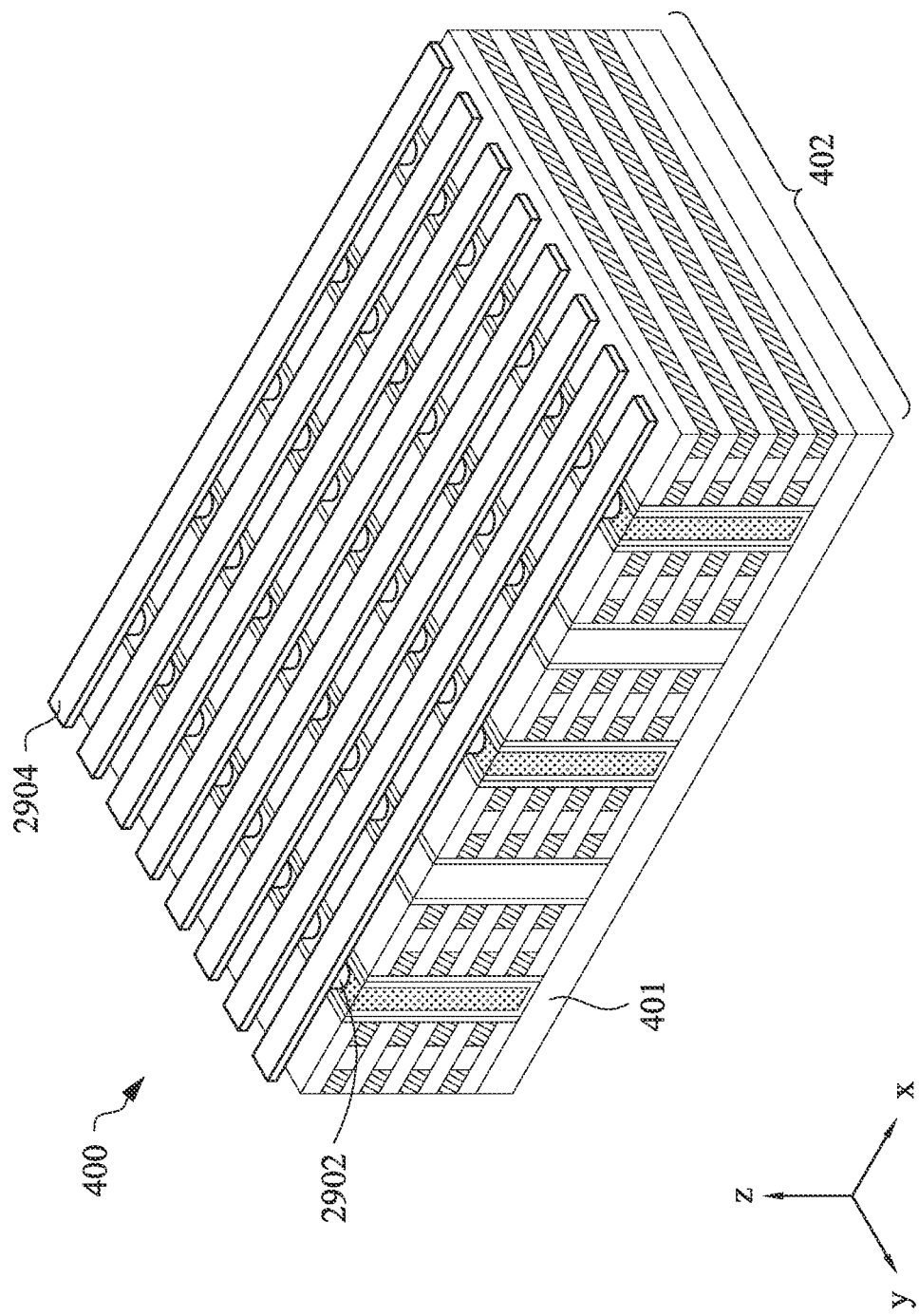
Figure 30:
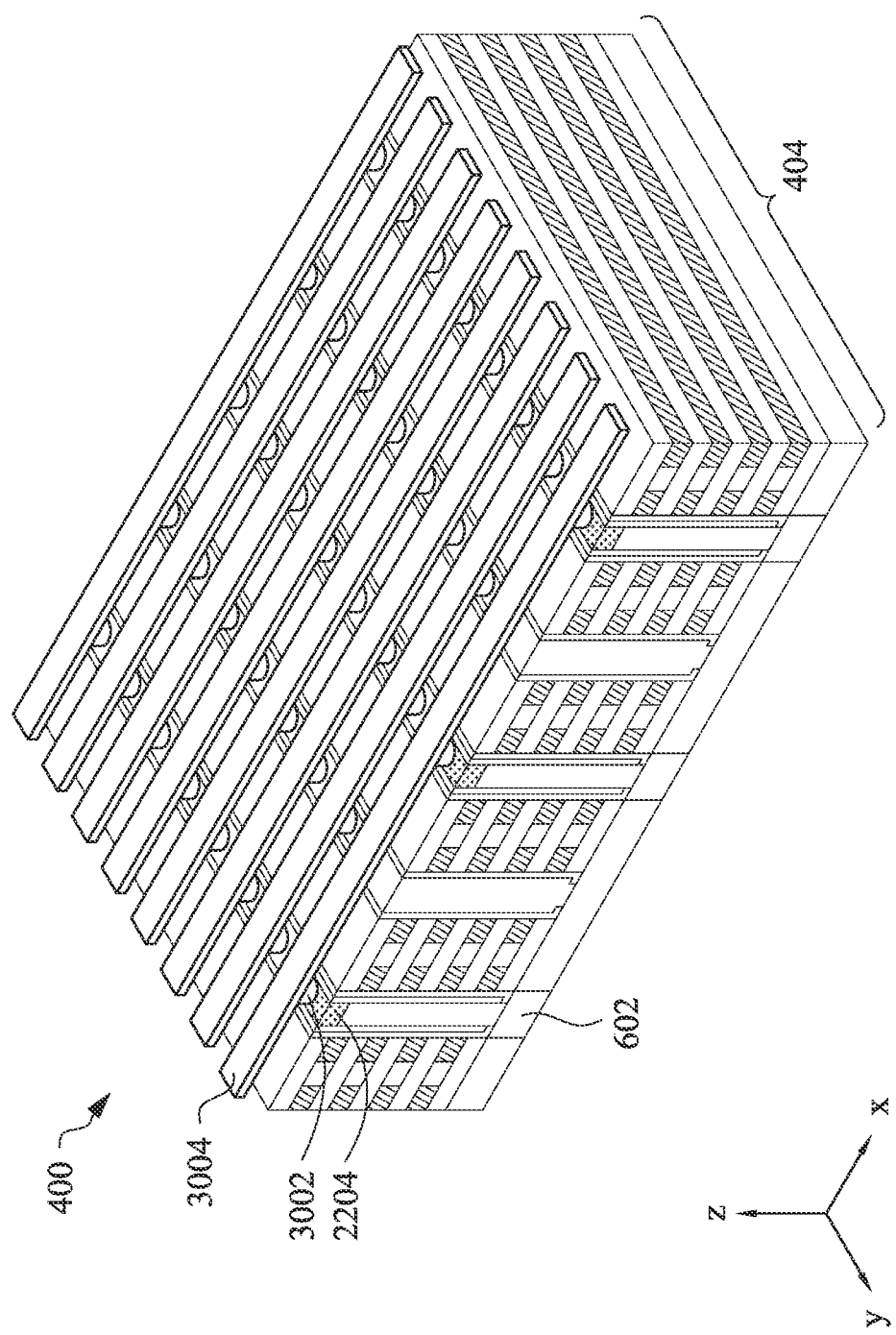

Corresponding to operation 326 of FIG. 3, FIGS. 29 and 30 illustrate perspective views of the first area 402 and the second area 404, respectively, of the memory device 400 in which first area metal routings 2902 and second area metal routings 3002 are formed, in accordance with various embodiments.

In the first area 402 as shown in FIG. 29, a plurality of first area vias 2902 may be formed on exposed portions of the first area SLs 2002 and the first area BLs 2004. The first area vias 2902 vertically extend to land on a respective first area SL 2002 or first area BL 2004. The first area vias 2902 may be formed from a metallic fill material. The metallic fill material includes at least one metal material selected from the group consisting of tungsten, copper, cobalt, ruthenium, titanium, tantalum, any other suitable material, or combinations thereof. The metallic fill material can be deposited by a conformal deposition method, which can be, for example, chemical vapor deposition (CVD), atomic layer deposition (ALD), electroless plating, electroplating, any other suitable method, or a combination thereof.

Next, first area metal routings 2904 may be formed in the first area 402 to electrically couple the first area vias 2902. In some embodiments, the first area metal routings 2904 may be formed to couple multiple first area SLs 2002 together along the X-direction. Similarly, the first area metal routings 2904 may be formed to couple multiple first area BLs 2004 along the X-direction. Each of the first area metal routings 2904 are formed as a horizontal conductive line, as shown in FIG. 29. The first area metal routings 2904 can be formed through a dual-damascene or single-damascene process by forming one or more horizontal and vertical trenches extending through an IMD and filling those trenches with a metallic fill material. The metallic fill material includes at least one metal material selected from the group consisting of tungsten, copper, cobalt, ruthenium, titanium, tantalum, any other suitable material, or combinations thereof. The metallic fill material can be deposited by a conformal deposition method, which can be, for example, chemical vapor deposition (CVD), atomic layer deposition (ALD), electroless plating, electroplating, any other suitable method, or a combination thereof. Upon forming the first area vias 2902 and the first area metal routings 2904, the first area 402 of the memory device 400 can be electrically coupled to a memory core control circuit. The memory core control circuit can provide different voltage levels of bias to the first area SLs 2002 and the first area BLs 2004.

In the second area 404 as shown in FIG. 30, a plurality of second area vias 3002 may be formed on exposed portions of the second area BLs 2204. The second area vias 3002 may be formed concurrently with the first area vias 2902. The second area vias 3002 vertically extend to land on a respective second area BL 2204. The second area vias 3002 may be formed from a metallic fill material. The metallic fill material includes at least one metal material selected from the group consisting of tungsten, copper, cobalt, ruthenium, titanium, tantalum, any other suitable material, or combinations thereof. The metallic fill material can be deposited by a conformal deposition method, which can be, for example, chemical vapor deposition (CVD), atomic layer deposition (ALD), electroless plating, electroplating, any other suitable method, or a combination thereof.

Next, second area metal routings 3004 may be formed in the second area 404 to electrically couple the second area vias 3002. The second area metal routings 3004 may be formed with concurrently with the first area metal routings 2904. In some embodiments, the second area metal routings 3004 may be formed to couple multiple second area BLs 2204 along the X-direction. Each of the second area metal routings 3004 are formed as a horizontal conductive line, as shown in FIG. 30. The second area metal routings 3004 can be formed through a dual-damascene or single-damascene process by forming one or more horizontal and vertical trenches extending through an IMD and filling those trenches with a metallic fill material. The metallic fill material includes at least one metal material selected from the group consisting of tungsten, copper, cobalt, ruthenium, titanium, tantalum, any other suitable material, or combinations thereof. The metallic fill material can be deposited by a conformal deposition method, which can be, for example, chemical vapor deposition (CVD), atomic layer deposition (ALD), electroless plating, electroplating, any other suitable method, or a combination thereof. Upon forming the second area vias 3002 and the second area metal routings 3004, the second area 404 of the memory device 400 can also be electrically coupled to the memory core control circuit. The memory core control circuit can provide different voltage levels of bias to the second area SLs 602 and the second area BLs 2204.

In one aspect of the present disclosure, a semiconductor device is disclosed. The semiconductor device includes a substrate having a first area and a second area. The semiconductor device in the first area includes a first memory layer extending along a vertical direction and a first semiconductor channel extending along the vertical direction. The first semiconductor channel is coupled to a portion of the first memory layer. The semiconductor device in the first area further includes a first conductive structure and a second conductive structure extending along the vertical direction. The first and second conductive structures are coupled to end portions of the first semiconductor channel. The semiconductor device in the second area includes a third conductive structure, and a second memory layer extending along the vertical direction and disposed above the third conductive structure. The semiconductor device in the second area further includes a second semiconductor channel extending along the vertical direction. The second semiconductor channel comprises: (i) a first vertical portion coupled to a portion of the second memory layer; and (ii) a lateral portion coupled to a top surface of the third conductive structure. The semiconductor device in the second area further includes a fourth conductive structure coupled to an end portion of the vertical portion of the second semiconductor channel.

In another aspect of the present disclosure, a memory device is disclosed. The memory device includes a first memory array including a plurality of first memory strings. Each first memory string has a plurality of first memory cells. The memory device further includes a second memory array including a plurality of second memory strings. Each second memory string has a plurality of second memory cells. Each of the plurality of first memory cells has a drain terminal and a source terminal. The drain terminals and source terminals of the plurality of first memory cells are electrically coupled to a first conductor structure and a second conductor structure, respectively. Each of the plurality of second memory cells has a drain terminal and a source terminal. The drain terminal of a first one of the plurality of second memory cells and the source terminal of a second one of the plurality of second memory cells are electrically coupled to a third conductor structure and a fourth conductor structure, respectively.

In yet another aspect of the present disclosure, a method for fabricating memory devices is disclosed. The method includes providing a substrate including a first and a second area. The method further includes forming a plurality of first conductor structures over the second area and forming a stack over both the first and second areas. The stack includes a plurality of insulating layers and a plurality of sacrificial layers alternatively stacked on top of each other. The stack includes forming, in the first area, a plurality of first semiconductor layers extending through the stack along a first lateral direction and a vertical direction. The plurality of first semiconductor layers are separated apart from one another during a second lateral direction. The method further includes forming, in the second area, a plurality of second semiconductor layers extending through the stack along the first lateral direction and the vertical direction. Each of the plurality of second semiconductor layers includes a first vertical portion and a second vertical portion connected to each other with a lateral portion.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a first area and a second area;
   wherein the semiconductor device in the first area comprises:
   a first memory layer extending along a vertical direction;
   a first semiconductor channel extending along the vertical direction and coupled to a portion of the first memory layer; and
   a first conductive structure and a second conductive structure extending along the vertical direction, wherein the first and second conductive structures are coupled to end portions of the first semiconductor channel;
   wherein the semiconductor device in the second area comprises:
   a third conductive structure;
   a second memory layer extending along the vertical direction and disposed above the third conductive structure;
   a second semiconductor channel extending along the vertical direction, wherein the second semiconductor channel comprises: (i) a first vertical portion coupled to a portion of the second memory layer; and (ii) a lateral portion coupled to a top surface of the third conductive structure, wherein a width of the third conductive structure is equal to or less than a width of a bottom surface of the second semiconductor channel, and wherein the third conductive structure is not in contact with the second memory layer; and
   a fourth conductive structure coupled to an end portion of the vertical portion of the second semiconductor channel.

2. The semiconductor device of claim 1, wherein the semiconductor device in the first area further comprises a plurality of fifth conductive structures, each of the plurality of fifth conductive structures extending along a first lateral direction and coupled to a respective portion of the first semiconductor channel with the first memory layer interposed therebetween.

3. The semiconductor device of claim 2, wherein the first conductive structure and the second conductive structure are spaced with respect to each other along the first lateral direction.

4. The semiconductor device of claim 2, wherein the semiconductor device in the first area further comprises:
   a third memory layer extending along the vertical direction; and
   a third semiconductor channel extending along the vertical direction and coupled a portion of the third memory layer, wherein the third semiconductor channel is separated apart from the first semiconductor channel along a second lateral direction perpendicular to the first lateral direction.

5. The semiconductor device of claim 4, wherein the semiconductor device in the first area further comprises:
   a plurality of sixth conductive structures, each of the plurality of sixth conductive structures extending along the first lateral direction and coupled to a respective portion of the third semiconductor channel with the third memory layer interposed therebetween.

6. The semiconductor device of claim 1, wherein the first memory layer has a vertical portion and a lateral portion, both of which are overlaid by the first semiconductor channel.

7. The semiconductor device of claim 1, wherein the semiconductor device in the second area further comprises a plurality of seventh conductive structures, each of the plurality of seventh conductive structures extending along a first lateral direction and coupled to a respective portion of the first vertical portion of the second semiconductor channel with the second memory layer interposed therebetween.

8. The semiconductor device of claim 7, wherein the semiconductor device in the second area further comprises a plurality of eighth conductive structures, each of the plurality of eighth conductive structures extending along the first lateral direction and coupled to a respective portion of a second vertical portion of the second semiconductor channel with a fourth memory layer interposed therebetween.

9. The semiconductor device of claim 8, wherein the first vertical portion and second vertical portion of the second semiconductor channel are coupled to each other through the lateral portion of the second semiconductor channel.

10. A memory device, comprising:
    a first memory array comprising a plurality of first memory strings extending in a vertical direction, each of which has a plurality of first memory cells; and
    a second memory array comprising a plurality of second memory strings extending in the vertical direction, each of which has a plurality of second memory cells;
    wherein each of the plurality of first memory cells has a drain terminal and a source terminal, and the drain terminals and source terminals of the plurality of first memory cells are electrically coupled to a first conductor structure and a second conductor structure, respectively; and
    wherein each of the plurality of second memory cells has a drain terminal and a source terminal, and the drain terminal of a first one of the plurality of second memory cells and the source terminal of a second one of the plurality of second memory cells are electrically coupled to a third conductor structure extending in a lateral direction and a fourth conductor structure, respectively,
    wherein each of the second memory strings further comprises a vertical memory layer, and a semiconductor channel having a vertical portion coupled to the memory layer and a lateral portion coupled to a top surface of the third conductor structure, and wherein the top surface of the third conductor structure is not in contact with memory layer.

11. The memory device of claim 10, wherein each of the plurality of first memory strings function as an AND memory string.

12. The memory device of claim 10, wherein each of the plurality of second memory strings function as a NAND memory string.

13. The memory device of claim 11, wherein the first memory array and the second memory array are formed on a single substrate.

14. The memory device of claim 10, wherein each of the plurality of first memory cells has a gate terminal formed as a fifth conductor structure extending along a first lateral direction, and the first and second conductor structures are each formed to vertically across the fifth conductor structures of the plurality of first memory cells.

15. The memory device of claim 10, wherein each of the plurality of second memory cells has a gate terminal formed as a sixth conductor structure extending along a first lateral direction, and the third and fourth conductor structures are vertically disposed above and below the sixth conductor structures of the plurality of second memory cells, respectively.

16. The memory device of claim 15, wherein the third conductor structure has a first width extending along a second lateral direction and the fourth conductor structure has a second width extending along the second lateral direction, and wherein the first width is equal to, less than, or greater than the second width.

17. A method for fabricating memory devices, comprising:
providing a substrate including a first area and a second area;
forming a plurality of first conductor structures over the first area;
forming a stack over both the first and second areas, the stack comprising a plurality of insulating layers and a plurality of sacrificial layers alternatively stacked on top of each other;
forming, in the first area, a plurality of first semiconductor layers extending through the stack along a first lateral direction and a vertical direction, wherein the plurality of first semiconductor layers are separated apart from one another along a second lateral direction;
forming, in the second area, a plurality of second semiconductor layers extending through the stack along the first lateral direction and the vertical direction, wherein each of the plurality of second semiconductor layers includes a first vertical portion and a second vertical portion connected to each other with a lateral portion;
cutting each of the plurality of first semiconductor layers into a plurality of first semiconductor channels that are separated from one another along the first lateral direction; and
cutting each of the plurality of second semiconductor layers into a plurality of second semiconductor channels that are separated from one another along the first lateral direction, wherein each of the plurality of second semiconductor channels is coupled to a corresponding one of the plurality of first conductor structures.

18. The method of claim 17, further comprising:
forming, in the first area, a plurality of second conductor structures and a plurality of third conductor structures extending along the vertical direction, wherein each of the plurality of first semiconductor channels is coupled to a corresponding one of the plurality of second conductor structures and a corresponding one of the plurality of third conductor structures; and
forming, in the second area, a plurality of fourth conductor structures, wherein each of the plurality of second semiconductor channels is coupled to a corresponding one of the plurality of fourth conductor structures.

19. The method of claim 17, wherein each of the plurality of first conductor structures function as an AND memory structure.

20. The method of claim 17, wherein each of the plurality of first conductor structures function as a NAND memory structure.

* * * * *